United States Patent
Banzashi et al.

(10) Patent No.: US 10,273,633 B2
(45) Date of Patent: Apr. 30, 2019

(54) METHODS FOR PRODUCING ULTRAFINE FIBER AND ULTRAFINE FIBER-CONTAINING SHEET, SHEET OBTAINED THEREBY, AND RESIN COMPOSITE COMPRISING LAMINATED RESINS

(71) Applicant: OJI HOLDINGS CORPORATION, Tokyo (JP)

(72) Inventors: Go Banzashi, Tokyo (JP); Shino Iwai, Tokyo (JP); Yuichi Noguchi, Tokyo (JP); Hayato Fushimi, Tokyo (JP)

(73) Assignee: OJI HOLDINGS CORPORATION, Tokyo (JP)

( * ) Notice: Subject to any disclaimer, the term of this patent is extended or adjusted under 35 U.S.C. 154(b) by 85 days.

(21) Appl. No.: 15/313,804

(22) PCT Filed: May 19, 2015

(86) PCT No.: PCT/JP2015/064319
§ 371 (c)(1),
(2) Date: Nov. 23, 2016

(87) PCT Pub. No.: WO2015/182438
PCT Pub. Date: Dec. 3, 2015

(65) Prior Publication Data
US 2017/0183820 A1    Jun. 29, 2017

(30) Foreign Application Priority Data

May 26, 2014   (JP) ................................. 2014-107721
May 26, 2014   (JP) ................................. 2014-107722
Nov. 20, 2014  (JP) ................................. 2014-235277

(51) Int. Cl.
| | |
|---|---|
| *D21H 11/20* | (2006.01) |
| *B32B 5/28* | (2006.01) |
| *D21H 11/18* | (2006.01) |
| *D21H 13/30* | (2006.01) |
| *G02F 1/1333* | (2006.01) |
| *G09F 9/00* | (2006.01) |
| *G09F 9/30* | (2006.01) |
| *H01L 51/50* | (2006.01) |
| *H05B 33/02* | (2006.01) |
| *B32B 5/02* | (2006.01) |
| *B32B 37/14* | (2006.01) |
| *D21H 11/04* | (2006.01) |
| *D21C 9/00* | (2006.01) |

(52) U.S. Cl.
CPC ............. *D21H 11/20* (2013.01); *B32B 5/02* (2013.01); *B32B 5/28* (2013.01); *B32B 37/14* (2013.01); *D21C 9/002* (2013.01); *D21C 9/007* (2013.01); *D21H 11/04* (2013.01); *D21H 11/18* (2013.01); *D21H 13/30* (2013.01); *G02F 1/1333* (2013.01); *G09F 9/00* (2013.01); *G09F 9/30* (2013.01); *H01L 51/50* (2013.01); *H05B 33/02* (2013.01); *B32B 2309/105* (2013.01); *B32B 2457/20* (2013.01)

(58) Field of Classification Search
CPC ........ D21H 11/20; D21H 13/30; D21H 11/04; B32B 37/14; B32B 5/02; B32B 2457/20; B32B 2309/105
USPC .......................................................... 428/323
See application file for complete search history.

(56) References Cited

U.S. PATENT DOCUMENTS

| | | | |
|---|---|---|---|
| 2011/0117319 A1 | 5/2011 | Yano et al. | |
| 2013/0338250 A1* | 12/2013 | Umemoto | ............. D21H 11/20 522/18 |

FOREIGN PATENT DOCUMENTS

| | | |
|---|---|---|
| CN | 102791789 A | 11/2012 |
| CN | 102862825 A | 1/2013 |
| CN | 103328716 A | 9/2013 |
| CN | 103429622 A | 12/2013 |
| EP | 2042655 A1 | 4/2009 |
| EP | 2548917 A1 | 1/2013 |
| EP | 2998435 A1 | 3/2016 |

(Continued)

OTHER PUBLICATIONS

Chinese Office Action and Search Report for corresponding Chinese Application No. 201580029746.8, dated Nov. 27, 2017, with an English translation of the Office Action.
English version of International Preliminary Report on Patentability dated Dec. 8, 2016, issued in PCT/JP2015/064319 (Forms PCT/IB/338; PCT/IB/373 and PCT/ISA/237).

(Continued)

*Primary Examiner* — Hui H Chin
(74) *Attorney, Agent, or Firm* — Birch, Stewart, Kolasch & Birch, LLP

(57) ABSTRACT

An object of the present invention is to provide a method for producing an ultrafine fiber-containing sheet with suppressed yellowing. The present invention provides a method for producing an ultrafine fiber-containing sheet, comprising (a) introducing a substituent having electrostatic and/or steric functionality to a fiber raw material to obtain substituent-introduced fiber; (b) machine-processing the substituent-introduced fiber obtained in the step (a) to obtain substituent-introduced ultrafine fiber; (c) preparing a sheet from the substituent-introduced ultrafine fiber obtained in the step (b); and (d) eliminating at least a portion of introduced substituents from the sheet obtained in the step (c). In a preferred aspect, the substituent having electrostatic and/or steric functionality is a phosphoric acid-derived group, and the method may further comprise, after the step (a) and before the step (c), the step of (e) changing the degree of neutralization of the substituent-introduced fiber or the substituent-introduced ultrafine fiber.

15 Claims, 2 Drawing Sheets

(56) References Cited

FOREIGN PATENT DOCUMENTS

| | | | |
|---|---|---|---|
| JP | 2008-308802 A | 12/2006 |
| JP | 2009-167397 A | 7/2009 |
| JP | 2009-299043 A | 12/2009 |
| JP | 2010-7010 A | 1/2010 |
| JP | 2010-254726 A | 11/2010 |
| JP | 2011-144363 A | 7/2011 |
| JP | 2012-1626 A | 1/2012 |
| JP | 2012-511596 A | 5/2012 |
| JP | 2014-141772 A | 8/2014 |
| JP | 2015-98526 A | 5/2015 |
| WO | WO 2011/013567 A1 | 2/2011 |
| WO | WO 2012/115115 A1 | 8/2012 |
| WO | WO 2013/073652 A1 | 5/2013 |
| WO | WO 2013/176033 A1 | 11/2013 |
| WO | WO 2013/176049 A1 | 11/2013 |
| WO | WO 2014/068196 A2 | 5/2014 |
| WO | WO 2014/068196 A3 | 5/2014 |

OTHER PUBLICATIONS

International Preliminary Report on Patentability dated Dec. 8, 2016, issued in PCT/JP2015/064319 (Forms PCT/IB/326; PCT/IB/373 and PCT/ISA/237).
International Search Report dated Aug. 25, 2015, issued in PCT/JP2015/064319 (Forms PCT/ISA/220; PCT/ISA/210 and PCT/ISA/237).
Extended European Search Report, dated Nov. 20, 2017, for corresponding European Application No. 15799394.0.
Japanese Office Action, dated Sep. 11, 2018, for corresponding Japanese Application No. 2016-523434, along with an English machine translation.
Taiwanese Office Action and Search Report, dated Sep. 10, 2018, for corresponding Taiwanese Application No. 104114728, along with a partial English translation of the Taiwanese Office Action.
Chinese Office Action and Search Report, dated Aug. 8, 2018, for corresponding Chinese Application No. 201580029746.8 is provided, along with a English translation of the Chinese Office Action.

* cited by examiner

METHODS FOR PRODUCING ULTRAFINE FIBER AND ULTRAFINE FIBER-CONTAINING SHEET, SHEET OBTAINED THEREBY, AND RESIN COMPOSITE COMPRISING LAMINATED RESINS

TECHNICAL FIELD

The present invention relates to a method for producing ultrafine fiber, a method for producing an ultrafine fiber-containing sheet, and a sheet obtained thereby. Specifically, the present invention relates to a method for producing a sheet having high transparency and suppressed thermal yellowing by implementing the step of eliminating a substituent at a predetermined stage in the production of a sheet containing substituent-introduced ultrafine fiber, and a sheet obtained thereby.

BACKGROUND ART

Currently, glass plates are used as most of substrates for organic EL or liquid crystal displays. However, the glass plates have a high specific gravity and the properties of being heavy, breakable, and rigid and are therefore considered to be difficult to adapt to the future weight reduction, flexibility, etc., of various displays. Accordingly, studies using plastic films such as polyimide or polycarbonate have been made as substitutes for the glass plates in recent years.

However, these plastic films, as compared with glass, have a high linear expansion coefficient and cause the warpage of the films or the fracture of electronic elements during the formation of the electronic elements (inorganic material) which requires a high-temperature process. Thus, the plastic films are difficult to put into practical use. Accordingly, for these purposes, there has been a demand for a novel material that has transparency and a low linear expansion coefficient comparable to those of glass and exhibits heat resistance and yellowing resistance against various process temperatures.

In recent years, cellulose ultrafine fiber having a fiber diameter of 1 μm or smaller has received attention. The cellulose ultrafine fiber is an assembly of cellulose crystals having a high modulus of elasticity and a low thermal expansion rate. A nonwoven fabric prepared from this ultrafine fiber and its composite with a transparent resin have been reported to have high transparency, a high modulus of elasticity, a low linear expansion coefficient, and flexible properties (Patent Literatures 1 and 2).

A method which involves introducing a substituent having electrostatic and/or steric functionality to a fiber raw material in order to facilitate nanofibrillation (defibration) of the fiber raw material is known as a method for producing cellulose ultrafine fiber having a small fiber diameter (e.g., Patent Literatures 3 to 6). The substituent having electrostatic and/or steric functionality, which has been introduced in ultrafine fiber, improves the dispersibility of the ultrafine fiber through electrostatic repulsion or the like. A sheet prepared using this ultrafine fiber has high transparency as compared with a substituent-unintroduced one.

Meanwhile, Patent Literature 7 discusses not only facilitating the nanofibrillation (defibration) of a fiber raw material but achieving the favorable water filterability and dewaterability of ultrafine fiber-containing slurry after nanofibrillation (defibration) while ameliorating time-dependent yellowing or thermal yellowing of the obtained ultrafine fiber and a sheet containing the ultrafine fiber. In this literature, improved ultrafine fiber is obtained by eliminating the introduced substituent from a slurry state after nanofibrillation (defibration) of the substituent-introduced ultrafine fiber.

Also, the heat treatment of the cellulose ultrafine fiber has been practiced. For example, studies have been made on a technique of suppressing staining and achieving high transparency, unstainability, a low linear expansion coefficient, and a high modulus of elasticity as a cellulose fiber composite by using cellulose heat-treated in the presence of a solvent after nanofiber formation (Patent Literature 8). Furthermore, a resin molded article in a sheet form having an improved tensile modulus of elasticity and a high fracture elongation is obtained by thermally denaturing cellulose oxide fiber for enhancement in its dispersibility in a resin and dispersing the fiber in the resin (Patent Literature 9).

PRIOR ART LITERATURE LIST

Patent Literature

[Patent Literature 1] JP Patent Publication (Kokai) No. 2010-7010
[Patent Literature 2] JP Patent Publication (Kokai) No. 2009-167397
[Patent Literature 3] JP Patent Publication (Kokai) No. 2010-254726
[Patent Literature 4] JP Patent Publication (Kokai) No. 2008-308802
[Patent Literature 5] International Publication No. WO 2013/073652
[Patent Literature 6] JP Patent Publication (Kohyo) No. 2012-511596
[Patent Literature 7] International Publication No. WO 2013/176049
[Patent Literature 8] JP Patent Publication (Kokai) No. 2011-144363
[Patent Literature 9] JP Patent Publication (Kokai) No. 2014-141772

SUMMARY OF INVENTION

Object to be Solved by the Invention

According to the studies of the present inventors, an ultrafine fiber-containing sheet obtained from cellulose ultrafine fiber having an introduced substituent having electrostatic and/or steric functionality becomes weak against heat and therefore presents problems with marked staining resulting from high-temperature treatment, though having high transparency. In addition, the elimination of the substituent from a slurry form may reduce dispersibility in water and cause aggregation. A sheet prepared directly therefrom presents the problem that the sheet itself is rarely highly transparent.

An object of the present invention is to provide a method for producing ultrafine fiber having high transparency and suppressed thermal yellowing, a method for producing an ultrafine fiber-containing sheet, a sheet obtained thereby, and a resin composite.

Solution to Problem

The present inventors have found that an ultrafine fiber-containing sheet and a resin composite having high transparency and reduced yellowing are obtained by eliminating the introduced substituent, for example, by boiling treatment with a polyhydric alcohol, after a sheet was formed from substituent-introduced ultrafine fiber.

The present inventors have also found that an ultrafine fiber-containing sheet and a resin composite having high transparency and reduced yellowing are obtained by changing the degree of neutralization of the introduced substituent in phosphoric acid-derived substituent-introduced fiber.

On the other hand, the methods of Patent Literatures 8 and 9 involve heat treatment in the presence of a solvent in the state of ultrafine fiber, but are not techniques that are performed for eliminating the introduced substituent. According to the studies of the present inventors, when a sheet formed from substituent-introduced ultrafine fiber was to be heat-treated in water, there arose inconvenience, which was not seen in the case of a polyhydric alcohol, in such a way that the sheet was swollen and broken. Therefore, the present inventors have also found a more practical method for elimination treatment of a substituent after a sheet was formed from substituent-introduced ultrafine fiber.

Provided that the elimination of the substituent prevents staining from occurring due to high-temperature treatment, various barrier layers can be laminated on the ultrafine fiber-containing sheet using various conditions. A challenge to the application of a sheet using ultrafine fiber having an introduced substituent having electrostatic and/or steric functionality to an optical member is change in dimension in a high-temperature and humidity environment. Although contraction attributed to humidity is largely influenced by the introduced substituent, a hydroxy group in cellulose is also responsible for this contraction. Therefore, it is necessary to block the hydroxy group or to provide a barrier layer.

The present invention provides the following:

[1] A method for producing an ultrafine fiber-containing sheet, comprising at least:
(a) introducing a substituent having electrostatic and/or steric functionality to a fiber raw material to obtain substituent-introduced fiber; (b) machine-processing the substituent-introduced fiber obtained in the step (a) to obtain substituent-introduced ultrafine fiber;
(c) preparing a sheet from the substituent-introduced ultrafine fiber obtained in the step (b); and
(d) eliminating at least a portion of introduced substituents from the sheet obtained in the step (c).

[2] A method for producing an ultrafine fiber-containing sheet, comprising at least:
(a) introducing a substituent having electrostatic and/or steric functionality to a fiber raw material to obtain substituent-introduced fiber;
(b) machine-processing the substituent-introduced fiber obtained in the step (a) to obtain substituent-introduced ultrafine fiber;
(c) preparing a sheet from the substituent-introduced ultrafine fiber obtained in the step (b); and
(d) eliminating at least a portion of introduced substituents by treating the sheet obtained in the step (c) with an alcohol.

[3] The method according to [2], wherein the alcohol is a polyhydric alcohol.

[4] The method according to [3], wherein the polyhydric alcohol has an OH/C ratio of 0.2 or more.

[5] The method according to any one of [1] to [4], wherein the substituent having electrostatic and/or steric functionality is at least one group selected from the group consisting of a phosphoric acid-derived group, a carboxylic acid-derived group, and a sulfuric acid-derived group.

[6] The method according to any one of [1] to [5], wherein the fiber raw material is a material containing cellulose, chitin, and/or chitosan.

[7] The method according to any one of [1] to [6], wherein the average fiber width of the ultrafine fiber is 2 to 1000 nm.

[8] The method according to any one of [1] to [7], wherein the substituent having electrostatic and/or steric functionality is a phosphoric acid-derived group, and the method further comprises, after the step (a) and before the step (c), the step of
(e) changing the degree of neutralization of the substituent-introduced fiber or the substituent-introduced ultrafine fiber.

[9] The method according to [8], wherein the step (e) is carried out such that the degree of neutralization is 15 to 85%.

[10] An ultrafine fiber-containing sheet which contains cellulose ultrafine fiber having an introduced group and having an average fiber width of 2 to 1000 nm, the group being at least one group selected from the group consisting of a phosphoric acid-derived group, a carboxylic acid-derived group, and a sulfuric acid-derived group, wherein the amount of the at least one group introduced, selected from the group consisting of a phosphoric acid-derived group, a carboxylic acid-derived group, and a sulfuric acid-derived group, is 0.01 to 0.1 mmol/g, and the total light transmittance is 85% or more, preferably 90% or more.

[11] A resin composite comprising a matrix resin laminated on one side or both sides of an ultrafine fiber-containing sheet according to [9].

[12] The resin composite according to [10], wherein the matrix resin comprises a thermosetting resin or a photocurable resin.

[13] A flexible display comprising a resin composite according to [10] or [11].

[14] A product comprising a resin composite according to [10] or [11] or a flexible display according to [12].

The present invention also provides the following:

[1] A method for producing ultrafine fiber, comprising at least:
(a) introducing a phosphoric acid-derived substituent to a fiber raw material to obtain substituent-introduced fiber;
(b) machine-processing the substituent-introduced fiber obtained in the step (a) to obtain substituent-introduced ultrafine fiber; and
(c) changing the degree of neutralization of the substituent-introduced fiber obtained in the step (a) or the substituent-introduced ultrafine fiber obtained in the step (b).

[2] The method according to [1], wherein the step (c) is carried out such that the degree of neutralization is 15 to 85%.

[3] The method according to [1] or [2], wherein the fiber raw material is a material containing cellulose, chitin, and/or chitosan.

[4] The method according to any one of [1] to [3], wherein the average fiber width of the ultrafine fiber is 2 to 1000 nm.

[5] A method for producing an ultrafine fiber-containing sheet, comprising:
(d) preparing a sheet from ultrafine fiber obtained by a method according to any one of [1] to [4].

[6] Ultrafine fiber or an ultrafine fiber-containing sheet which contains cellulose ultrafine fiber having an introduced phosphoric acid-derived substituent and having an average fiber width of 2 to 1000 nm, wherein the amount of the phosphoric acid-derived substituent introduced is 0.01 to 2.0 mmol/g, and the degree of neutralization is 15 to 85%.

[7] A resin composite comprising a matrix resin laminated on one side or both sides of an ultrafine fiber-containing sheet according to [6].

[8] The resin composite according to [7], wherein the matrix resin comprises a thermosetting resin or a photocurable resin.

[9] A flexible display comprising a resin composite according to [7] or [8].

[10] A product comprising a resin composite according to [7] or [8] or a flexible display according to [9].

The present invention also provides the following:

[1] A composite sheet comprising a base sheet layer comprising ultrafine fiber, and an inorganic layer formed on at least one side of the base sheet layer.

[2] The composite sheet according to 1, wherein the ultrafine fiber is ultrafine fiber having an introduced substituent having electrostatic and/or steric functionality.

[3] The composite sheet according to 1 or 2, further comprising an organic layer formed on at least one side of the base sheet layer.

[4] The composite sheet according to any one of 1 to 3, wherein the ultrafine fiber is cellulose ultrafine fiber having an average fiber width of 2 to 1000 nm.

[5] The composite sheet according to any one of 1 to 4, wherein the substituent is at least one group selected from the group consisting of a phosphoric acid-derived group, a carboxylic acid-derived group, and a sulfuric acid-derived group, and the amount of the substituent introduced is 0.01 to 2.0 mmol/g.

[6] The composite sheet according to any one of 1 to 5, wherein the thickness of the base sheet layer is 0.1 to 1200 μm.

[7] The composite sheet according to any one of 1 to 6, wherein the inorganic layer comprises at least one member selected from the group consisting of silicon oxide, silicon nitride, silicon oxycarbide, silicon oxynitride, silicon oxycarbonitride, aluminum oxide, aluminum nitride, aluminum oxycarbide, and aluminum oxynitride.

[8] The composite sheet according to any one of 1 to 7, wherein the organic layer comprises a thermosetting resin or a photocurable resin.

[9] The composite sheet according to any one of 1 to 8, wherein
the base sheet layer is produced by a production method comprising:
(a) obtaining substituent-introduced fiber from a fiber raw material;
(b) machine-processing the substituent-introduced fiber obtained in the step (a) to obtain substituent-introduced ultrafine fiber;
(c) preparing a sheet from the substituent-introduced ultrafine fiber obtained in the step (b); and
(d) eliminating at least a portion of introduced substituents from the sheet obtained in the step (c).

[10] The composite sheet according to 9, wherein
the substituent having electrostatic and/or steric functionality is a phosphoric acid-derived group, and the base sheet layer is produced by the production method further comprising, after the step (a) and before the step (c), the step of
(e) changing the degree of neutralization of the substituent-introduced fiber or the substituent-introduced ultrafine fiber.

[11] The composite sheet according to any one of 1 to 10, wherein
an inorganic layer and an organic layer laminated on the inorganic layer are disposed, or an organic layer and an inorganic layer laminated on the organic layer are disposed, on at least one side of the base sheet layer.

[12] A flexible display, a solar cell, a lighting element, a display element, a touch panel, a window material, or a structural material comprising a composite sheet according to 11.

[13] A product comprising a composite sheet according to any one of 1 to 11 or a solar cell, a lighting element, a display element, a touch panel, a window material, or a structural material according to 11.

The present invention further provides the following:

[1] A method for producing an ultrafine fiber-containing sheet, comprising at least:
(a) introducing a substituent having electrostatic and/or steric functionality to a fiber raw material to obtain substituent-introduced fiber;
(b) machine-processing the substituent-introduced fiber obtained in the step (a) to obtain substituent-introduced ultrafine fiber;
(c) preparing a sheet from the substituent-introduced ultrafine fiber obtained in the step (b); and (d) eliminating at least a portion of introduced substituents from the sheet obtained in the step (c).

[2] The method according to 1, wherein the step (d) is the step of eliminating at least a portion of introduced substituents by treating the sheet obtained in the step (c) with water and/or an alcohol.

[3] The method according to 2, wherein the treatment with water and/or an alcohol in the step (d) is treatment with vapor of water and/or the alcohol.

[4] The method according to 3, wherein the vapor is high-pressure vapor of 0.1 MPa to 30 MPa.

[5] The method according to 1, wherein the step (d) is the step of eliminating at least a portion of introduced substituents by treating the sheet obtained in the step (c) with a polyhydric alcohol.

[6] The method according to 5, wherein the polyhydric alcohol has an OH/C ratio of 0.2 or more.

[7] The method according to any one of 1 to 6, wherein the substituent having electrostatic and/or steric functionality is at least one group selected from the group consisting of a phosphoric acid-derived group, a carboxylic acid-derived group, and a sulfuric acid-derived group.

[8] The method according to any one of 1 to 7, wherein the fiber raw material is a material containing cellulose, chitin, and/or chitosan.

[9] The method according to any one of 1 to 8, wherein the average fiber width of the ultrafine fiber is 2 to 1000 nm.

[10] The method according to any one of 1 to 9, wherein
the substituent having electrostatic and/or steric functionality is a phosphoric acid-derived group, and the method further comprises, after the step (a) and before the step (c), the step of
(e) changing the degree of neutralization of the substituent-introduced fiber or the substituent-introduced ultrafine fiber.

[11] The method according to 10, wherein the step (e) is carried out such that the degree of neutralization is 15 to 85%.

[12] An ultrafine fiber-containing sheet produced by a method according to any one of 1 to 11.

[13] A composite sheet comprising a base sheet layer composed of an ultrafine fiber-containing sheet produced by a method according to any one of 1 to 11, and an inorganic layer and/or an organic layer formed on at least one side of the base sheet layer.

[14] The composite sheet according to 13, wherein the thickness of the base sheet layer is 0.1 to 1200 μm.

[15] The composite sheet according to 13 or 14, wherein the inorganic layer comprises at least one member selected from the group consisting of silicon oxide, silicon nitride, silicon oxycarbide, silicon oxynitride, silicon oxycarbonitride, aluminum oxide, aluminum nitride, aluminum oxycarbide, and aluminum oxynitride.

[16] The composite sheet according to any one of 13 to 15, wherein the organic layer comprises a thermosetting resin or a photocurable resin.

[17] The composite sheet according to any one of 13 to 15, wherein an inorganic layer and an organic layer laminated on the inorganic layer are disposed, or an organic layer and an inorganic layer laminated on the organic layer are disposed, on at least one side of the base sheet layer.

[18] A flexible display, a solar cell, a lighting element, a display element, a touch panel, a window material, or a structural material comprising a composite sheet according to any one of 13 to 17.

[19] A product comprising a composite sheet according to any one of 13 to 17 or a solar cell, a lighting element, a display element, a touch panel, a window material, or a structural material according to 18.

Advantageous Effects of Invention

According to the present invention, the time-dependent yellowing or thermal yellowing of an ultrafine fiber-containing sheet and a resin composite can be suppressed.

According to the present invention, a substituent-introduced ultrafine fiber-containing sheet can be used as a base material to constitute a composite sheet that has transparency, flexibility, and a low linear thermal expansion coefficient and is further provided with moisture resistance.

The present invention provides a technique of efficiently eliminating the introduced substituent after a sheet was formed from substituent-introduced ultrafine fiber. As a result, the time-dependent yellowing or thermal yellowing of the ultrafine fiber-containing sheet can be suppressed.

DESCRIPTION OF EMBODIMENTS

Figure 1:
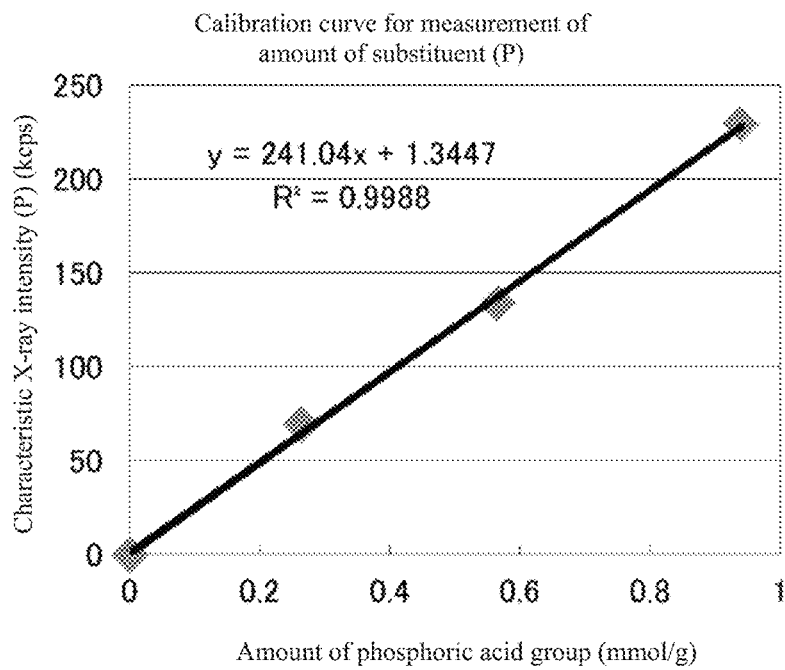
FIG. 1 shows a calibration curve for an ultrafine fiber-containing sheet. A nonwoven fabric having a known amount of a phosphoric acid group was prepared. After implementation of fluorescent X-ray analysis, a calibration curve of the characteristic X-ray intensity of a P atom vs. the amount of the phosphoric acid group introduced was prepared and subjected to an experiment.

In the description of the present invention, embodiments thereof, and Examples thereof, the terms "part" and "%" mean part by mass and % by mass, respectively, unless otherwise specified. The numerical range "a to b" includes both of the values a and b unless otherwise specified. The term "A and/or B" refers to at least one of A and B and may mean only A, may mean only B, or may mean both A and B, unless otherwise specified.

The method for producing an ultrafine fiber-containing sheet according to the present invention comprises at least:

(a) introducing a substituent having electrostatic and/or steric functionality to a fiber raw material to obtain substituent-introduced fiber;

(b) machine-processing the substituent-introduced fiber obtained in the step (a) to obtain substituent-introduced ultrafine fiber;

(c) preparing a sheet from the substituent-introduced ultrafine fiber obtained in the step (b); and (d) eliminating at least a portion of introduced substituents from the sheet obtained in the step (c).

[Step (a)]

The step (a) is the step of introducing a substituent having electrostatic and/or steric functionality to a fiber raw material to obtain substituent-introduced fiber. The step (a) is not particularly limited, and the substituent can be introduced to the fiber raw material by mixing the fiber raw material in a dry state or in a wet state with a compound that is reactive with the fiber raw material. A heating method is particularly effective for accelerating the reaction for the introduction. The heat treatment temperature for the introduction of the substituent is not particularly limited and is preferably a temperature zone in which the thermal decomposition, hydrolysis, or the like of the fiber raw material is less likely to occur. In the case of selecting, for example, a fiber raw material comprising cellulose as the fiber raw material, 250° C. or lower is preferred from the viewpoint of thermal decomposition temperature, and heat treatment at 100 to 170° C. is preferred from the viewpoint of suppressing cellulose hydrolysis.

Examples of the fiber raw material used in the present invention include, but are not particularly limited to, inorganic fiber, organic fiber, synthetic fiber, semisynthetic fiber, and regenerated fiber. Examples of the inorganic fiber include, but are not limited to, glass fiber, rock fiber, and metal fiber. Examples of the organic fiber include, but are not limited to, natural product-derived fiber such as cellulose, carbon fiber, pulp, chitin, and chitosan. Examples of the synthetic fiber include, but are not limited to, nylon, vinylon, vinylidene, polyester, polyolefin (e.g., polyethylene and polypropylene), polyurethane, acryl, polyvinyl chloride, and aramid. Examples of the semisynthetic fiber include, but are not limited to, acetate, triacetate, and promix. Examples of the regenerated fiber include, but are not limited to, rayon, cupra, polynosic rayon, lyocell, and Tencel.

The fiber raw material used in the present invention desirably contains a hydroxyl group or an amino group without particular limitations because of facilitating substituent introduction mentioned later.

The fiber raw material is not particularly limited, and pulp is preferably used from the viewpoint of easy availability and inexpensiveness. The pulp is selected from wood pulp, non-wood pulp, and deinking pulp. Examples of the wood pulp include, but are not particularly limited to: chemical pulp such as leaf bleached kraft pulp (LBKP), needle bleached kraft pulp (NBKP), sulfite pulp (SP), alkaline pulp (AP), unbleached kraft pulp (UKP), and oxygen-delignified kraft pulp (OKP); semichemical pulp such as semichemical pulp (SCP) and chemiground wood pulp (CGP); and mechanical pulp such as ground pulp (GP) and thermomechanical pulp (TMP and BCTMP). Examples of the non-wood pulp include, but are not particularly limited to: cotton-based pulp such as cotton linter and cotton lint; non-wood-based pulp such as linen, straw, and bagasse; and cellulose, chitin, and chitosan which are isolated from sea squirt, seaweed, or the like. Examples of the deinking pulp include, but are not particularly limited to, deinking pulp prepared using used paper as a raw material. As the pulp of the present invention, one of these pulps may be used alone, or two or more thereof may be used as a mixture. Among these pulps, cellulose-containing wood pulp or deinking pulp is preferred from the viewpoint of easy availability. Among the wood pulps, chemical pulp has a large proportion of cellulose and is therefore particularly preferred from the viewpoint of achieving a high yield of cellulose ultrafine fiber at the time of fiber nanofibrillation (defibration) and the small decomposition of cellulose in the pulp, and obtaining long-fibered cellulose ultrafine fiber having a large axial ratio, though the pulp is not particularly limited thereto. Among them, kraft pulp or sulfite pulp is most preferably selected, though the pulp is not particularly limited thereto. A sheet containing this long-fibered cellulose ultrafine fiber having a large axial ratio produces high strength.

Examples of the compound reactive with the fiber raw material include, but are not particularly limited to, a compound having a phosphoric acid-derived group, a compound having a carboxylic acid-derived group, a compound having a sulfuric acid-derived group, a compound having a sulfonic acid-derived group, a compound having an alkyl group having 10 or more carbon atoms, and a compound having an amine-derived group. A compound having at least one group selected from the group consisting of a phosphoric acid-derived group, a carboxylic acid-derived group, and a sulfuric acid-derived group is preferred because of its easy handling and reactivity with ultrafine fiber. More preferably, any of these compounds forms ester or/and amide with ultrafine fiber without particular limitations.

The compound having a phosphoric acid-derived group, used in the present invention is not particularly limited and is at least one member selected from the group consisting of phosphoric acid, polyphosphoric acid, phosphorous acid, phosphonic acid, polyphosphonic acid, and their salts and esters. Among them, a compound having phosphoric acid group is preferred because the compound has low cost, is easily handled, and can further improve nanofibrillation (defibration) efficiency by introducing the phosphoric acid group to the fiber raw material, though the compound is not particularly limited thereto.

Examples of the compound having a phosphoric acid group include, but are not particularly limited to: phosphoric acid; lithium dihydrogen phosphate, dilithium hydrogen phosphate, trilithium phosphate, lithium pyrophosphate, and lithium polyphosphate, which are lithium salts of phosphoric acid; sodium dihydrogen phosphate, disodium hydrogen phosphate, trisodium phosphate, sodium pyrophosphate, and sodium polyphosphate, which are sodium salts of phosphoric acid; potassium dihydrogen phosphate, dipotassium hydrogen phosphate, tripotassium phosphate, potassium pyrophosphate, and potassium polyphosphate, which are potassium salts of phosphoric acid; and ammonium dihydrogen phosphate, diammonium hydrogen phosphate, triammonium phosphate, ammonium pyrophosphate, and ammonium polyphosphate, which are ammonium salts of phosphoric acid.

Among them, phosphoric acid, a sodium salt of phosphoric acid, a potassium salt of phosphoric acid, or an ammonium salt of phosphoric acid is preferred, and sodium dihydrogen phosphate or disodium hydrogen phosphate is more preferred, from the viewpoint of high phosphoric acid group introduction efficiency and easy industrial applicability, though the compound is not particularly limited thereto.

The compound is preferably used as an aqueous solution without particular limitations because of its reaction homogeneity and high introduction efficiency of phosphoric acid-derived group. The pH of the aqueous solution of the compound is not particularly limited and is preferably 7 or lower because of producing high introduction efficiency of phosphoric acid group. The pH is particularly preferably 3 to 7 from the viewpoint of suppressing fiber hydrolysis, though the pH is not particularly limited thereto.

The compound having a carboxylic acid-derived group, used in the present invention is not particularly limited and is at least one member selected from the group consisting of a compound having a carboxyl group, an acid anhydride of the compound having a carboxyl group, and their derivatives.

Examples of the compound having a carboxyl group include, but are not particularly limited to: dicarboxylic acid compounds such as maleic acid, succinic acid, phthalic acid, fumaric acid, glutaric acid, adipic acid, and itaconic acid; and tricarboxylic acid compounds such as citric acid and aconitic acid.

Examples of the acid anhydride of the compound having a carboxyl group include, but are not particularly limited to, acid anhydrides of dicarboxylic acid compounds, such as maleic anhydride, succinic anhydride, phthalic anhydride, glutaric anhydride, adipic anhydride, and itaconic anhydride.

Examples of the derivative of the compound having a carboxyl group include, but are not particularly limited to, an imidized form of the acid anhydride of the compound having a carboxyl group, and a derivative of the acid anhydride of the compound having a carboxyl group. Examples of the imidized form of the acid anhydride of the compound having a carboxyl group include, but are not particularly limited to, imidized forms of dicarboxylic acid compounds, such as maleimide, succinimide, and phthalimide.

Examples of the derivative of the acid anhydride of the compound having a carboxyl group include, but are not particularly limited to, compounds derived from the acid anhydride of the compound having a carboxyl group by the replacement of at least a portion of hydrogen atoms with a substituent (e.g., an alkyl group or a phenyl group), such as dimethylmaleic anhydride, diethylmaleic anhydride, and diphenylmaleic anhydride.

Among these compounds having a carboxylic acid-derived group, maleic anhydride, succinic anhydride, or phthalic anhydride is preferred because of its easy industrial applicability and easy gasification, though the compound is not particularly limited thereto.

The compound having a sulfuric acid-derived group, used in the present invention is not particularly limited and is at least one member selected from the group consisting of sulfuric anhydride, sulfuric acid, and their salts and esters. Among them, sulfuric acid is preferred because the compound has low cost and can further improve nanofibrillation (defibration) efficiency by introducing the sulfuric acid group to the fiber raw material, though the compound is not particularly limited thereto.

The step (a) can introduce the substituent to the fiber raw material, thereby improving the dispersibility of the fiber in a solution and enhancing defibration efficiency.

The amount of the substituent introduced (based on a titration method) in the substituent-introduced fiber obtained in the step (a) is not particularly limited and is preferably $0.005\alpha$ to $0.11\alpha$, more preferably $0.01\alpha$ to $0.08\alpha$, per g (mass) of the fiber. If the amount of the substituent introduced is less than $0.005\alpha$, the nanofibrillation (defibration) of the fiber raw material is difficult. If the amount of the substituent introduced exceeds $0.11\alpha$, the fiber might be lysed. In this context, $\alpha$ represents the amount (unit: mmol/ g) of a functional group that can be reacted with the compound reactive with the fiber material, for example, a hydroxyl group or an amino group, contained per g of the fiber material. The amount of the substituent introduced (titration method) on the fiber surface can be measured by the following method, unless otherwise specified: ultrafine fiber-containing slurry having a solid content of approximately 0.04 g in terms of absolute dry mass is separated and diluted to approximately 50 g using ion-exchange water. When a 0.01 N aqueous sodium hydroxide solution is added dropwise to this solution with stirring, change in the value of electric conductivity is measured. The amount of the 0.01 N aqueous sodium hydroxide solution added dropwise that offers the smallest value of electric conductivity is defined as the amount of the solution added dropwise at the titration end-point. An amount X of the substituent on the cellulose surface is represented by X (mmol/g)=0.01 (mol/l)×V (ml)/W (g). In this context, V: the amount of the 0.01 N aqueous sodium hydroxide solution added dropwise (ml), and W: the solid content (g) in the cellulose ultrafine fiber-containing slurry.

<Alkali Treatment>

If necessary, alkali treatment may be carried out after the step (a) of introducing a substituent having electrostatic and/or steric functionality to obtain substituent-introduced fiber and before the step (b) (machine process step) mentioned later. The alkali treatment can supply a cation to the phosphoric acid group introduced in the fiber to easily form a salt. The alkali treatment is also preferred from the viewpoint of improving a fiber yield.

The method for the alkali treatment is not particularly limited. The alkali treatment can be carried out, for example, by dipping the phosphoric acid group-introduced cellulose fiber in an alkali solution.

The alkali compound contained in the alkali solution may be an inorganic alkali compound or may be an organic alkali compound.

Examples of the inorganic alkali compound are hydroxides, carbonates, and phosphates of alkali metals or alkaline earth metals. More specific examples thereof are lithium hydroxide, sodium hydroxide, potassium hydroxide, calcium hydroxide, lithium carbonate, lithium bicarbonate, potassium carbonate, potassium bicarbonate, sodium carbonate, sodium bicarbonate, calcium carbonate, lithium phosphate, potassium phosphate, trisodium phosphate, disodium hydrogen phosphate, calcium phosphate, and calcium hydrogen phosphate.

Examples of the organic alkali compound are ammonia, aliphatic amine, aromatic amine, aliphatic ammonium, aromatic ammonium, heterocyclic compounds, and their hydroxides, carbonates, and phosphates. More specific examples are ammonia, hydrazine, methylamine, ethylamine, diethylamine, triethylamine, propylamine, dipropylamine, butylamine, diaminoethane, diaminopropane, diaminobutane, diaminopentane, diaminohexane, cyclohexylamine, aniline, tetramethylammonium hydroxide, tetraethylammonium hydroxide, tetrapropylammonium hydroxide, tetrabutylammonium hydroxide, benzyltrimethylammonium hydroxide, pyridine, N,N-dimethyl-4-aminopyridine, ammonium carbonate, ammonium bicarbonate, and diammonium hydrogen phosphate.

The solvent for the alkali solution is not particularly limited, and water and/or an organic solvent can be used. A solvent having polarity (polar organic solvent such as water and an alcohol) is preferred, and an aqueous solvent including water is more preferred. Particularly preferred examples of the alkali solution are an aqueous sodium hydroxide solution and an aqueous potassium hydroxide solution.

The pH at 25° C. of the alkali solution with the phosphoric acid group-introduced cellulose dipped therein can be appropriately set and is preferably 9 or higher, more preferably 10 or higher, further preferably 11 or higher. This is because the yield of the cellulose fiber is further increased. In any case, the pH of the alkali solution at 25° C. is preferably 14 or lower. This is because a pH exceeding 14 reduces the handleability of the alkali solution.

In order to decrease the amount of the alkali solution used, the phosphoric acid group-introduced cellulose fiber may be washed before the alkali treatment step. Water and/or an organic solvent can be used in the washing. Also in order to improve handleability, the phosphoric acid group-introduced cellulose fiber thus alkali-treated may be washed with water and/or an organic solvent after the alkali treatment and before the machine process mentioned below.

[Step (b)]

The step (b) is the step of subjecting the substituent-introduced fiber obtained in the step (a) to nanofibrillation (defibration) treatment using a defibration treatment apparatus to obtain substituent-introduced ultrafine fiber.

The defibration treatment apparatus is not particularly limited, and, for example, a wet milling apparatus such as a high-speed defibrillator, a grinder (stone mill-type crusher), a high-pressure homogenizer, an ultrahigh-pressure homogenizer, Clearmix, a high-pressure collision-type crusher, a ball mill, a bead mill, a disc-type refiner, a conical refiner, a twin-screw kneader, an oscillation mill, and a homomixer under high-speed rotation, an ultrasonic disperser, or a beater can be appropriately used.

For the defibration treatment, the substituent-introduced fiber obtained in the step (a) is preferably diluted into slurry using water and an organic solvent each alone or in combination without particular limitations. The solid concentration of the substituent-introduced fiber thus diluted is not particularly limited and is preferably 0.1 to 20% by mass, more preferably 0.5 to 10% by mass. When the solid concentration of the diluted substituent-introduced fiber is equal to or higher than the lower limit described above, the efficiency of the defibration treatment is improved. When the solid concentration of the diluted substituent-introduced fiber is equal to or lower than the upper limit described above, clogging in the defibration treatment apparatus can be prevented. The dispersion medium is not particularly limited, and water as well as a polar organic solvent can be used. Preferred examples of the polar organic solvent include, but are not particularly limited to: alcohols such as methanol, ethanol, n-propanol, isopropanol, n-butanol, and t-butyl alcohol; ketones such as acetone and methyl ethyl ketone (MEK); ethers such as diethyl ether and tetrahydrofuran (THF); and dimethyl sulfoxide (DMSO), dimethylformamide (DMF), and dimethylacetamide (DMAc). One of these solvents may be used, or two or more thereof may be used. A nonpolar organic solvent may be used in addition to water and the polar organic solvent described above so long as the dispersion stability of the ultrafine fiber-containing slurry is not impaired.

The content of the ultrafine fiber in the ultrafine fiber-containing slurry after the nanofibrillation (defibration) treatment is not particularly limited and is preferably 0.02 to 10% by mass, more preferably 0.1 to 5% by mass. When the content of the ultrafine fiber falls within the range described above, production efficiency is excellent for the production of the sheet mentioned later, and the dispersion stability of the slurry is excellent.

In the present invention, the fiber width of the substituent-introduced ultrafine fiber obtained by the nanofibrillation (defibration) is not particularly limited and is preferably 1 to 1000 nm, more preferably 2 to 500 nm, further preferably 3 to 100 nm. If the fiber width of the ultrafine fiber is smaller than 1 nm, the resulting ultrafine fiber does not exert its physical properties (strength, rigidity, and dimensional stability) because the molecule is dissolved in water. On the other hand, if the fiber width of the ultrafine fiber exceeds 1000 nm, the resultant does not serve as ultrafine fiber and does not produce physical properties (strength, rigidity, and dimensional stability) as ultrafine fiber.

For purposes that require the transparency of ultrafine fiber, if the fiber width exceeds 30 nm, the resulting ultrafine fiber tends to cause the refraction and scattering of visible light at the interface in a composite with a matrix material because of approaching 1/10 of the wavelength of the visible light, and tends to reduce its transparency. Therefore, the fiber width is not particularly limited and is preferably 2 to 30 nm, more preferably 2 to 20 nm. A composite obtained from the ultrafine fiber as described above is generally a closely-packed structure and therefore has high strength. This composite also produces high transparency because of the low scattering of visible light.

The fiber width of the ultrafine fiber is measured as follows: ultrafine fiber-containing slurry having a concentration of 0.05 to 0.1% by mass is prepared, and the slurry is casted onto a hydrophilized carbon film-coated grid to prepare a sample for TEM observation. If the sample contains wide fiber, SEM images of the surface of the slurry casted onto glass may be observed. The sample is observed using electron microscope images taken at a magnification of 1000×, 5000×, 10000×, 20000×, or 50000× according to the width of the constituent fiber. However, the sample, the observation conditions, and the magnification are adjusted so as to satisfy the following conditions:
(1) one straight line X is drawn at an arbitrary site in an observation image, and 20 or more fiber filaments intersect the straight line X; and
(2) a straight line Y vertically intersecting the straight line in the same image is drawn, and 20 or more fiber filaments intersect the straight line Y.

The width of the fiber interlocking the straight line X and the straight line Y is visually read for observation images that satisfy the conditions described above. In this way, 3 or more images of at least surface portions that do not overlap with each other are observed, and the width of the fiber interlocking the straight line X and the straight line Y is read for each of the images. In this way, the fiber widths of at least 20 filaments×2×3=120 filaments are read. The fiber width according to the present invention is the average value of the fiber widths thus read.

The fiber length of the ultrafine fiber is not particularly limited and is preferably 0.1 μm or larger. If the fiber length is smaller than 0.1 μm, the effect of improving strength is difficult to obtain in a composite of the ultrafine fiber with a resin. The fiber length can be determined by TEM, SEM, or AFM image analysis. The fiber length is a fiber length that accounts for 30% by mass or more of the ultrafine fiber.

The axial ratio (fiber length/fiber width) of the ultrafine fiber is not particularly limited and is preferably in the range of 20 to 10000. If the axial ratio is less than 20, the ultrafine fiber-containing sheet might be difficult to form. An axial ratio exceeding 10000 is not preferred because the slurry viscosity is increased.

[Step (c)]

The step (c) is the step of preparing a sheet from the substituent-introduced ultrafine fiber obtained in the step (b).

The sheet is not particularly limited and can also be prepared by mixing the ultrafine fiber with at least one or more fibers other than the ultrafine fiber (hereinafter, referred to as "additional fiber"). Examples of the additional fiber include, but are not particularly limited to, inorganic fiber, organic fiber, synthetic fiber, semisynthetic fiber, and regenerated fiber. Examples of the inorganic fiber include, but are not limited to, glass fiber, rock fiber, and metal fiber. Examples of the organic fiber include, but are not limited to, natural product-derived fiber such as cellulose, carbon fiber, pulp, chitin, and chitosan. Examples of the synthetic fiber include, but are not limited to, nylon, vinylon, vinylidene, polyester, polyolefin (e.g., polyethylene and polypropylene), polyurethane, acryl, polyvinyl chloride, and aramid. Examples of the semisynthetic fiber include, but are not limited to, acetate, triacetate, and promix. Examples of the regenerated fiber include, but are not limited to, rayon, cupra, polynosic rayon, lyocell, and Tencel. The additional fiber can be subjected, if necessary, to a treatment such as chemical treatment or defibration treatment. In the case of subjecting the additional fiber to a treatment such as chemical treatment or defibration treatment, the additional fiber may be subjected to the treatment such as chemical treatment or defibration treatment after being mixed with the ultrafine fiber, or may be mixed with the ultrafine fiber after being subjected to the treatment such as chemical treatment or defibration treatment.

For the mixing with the additional fiber, the amount of the additional fiber added with respect to the total amount of the ultrafine fiber and the additional fiber is not particularly limited and is preferably 50% by mass or smaller, more preferably 40% by mass or smaller, further preferably 30% by mass or smaller, particularly preferably 20% by mass or smaller.

A hydrophilic polymer may be added for the preparation of the sheet. Examples of the hydrophilic polymer can include, but are not particularly limited to, polyethylene glycol, cellulose derivatives (hydroxyethylcellulose, carboxyethylcellulose, carboxymethylcellulose, etc.), casein, dextrin, starch, modified starch, polyvinyl alcohol, modified polyvinyl alcohol (acetoacetylated polyvinyl alcohol, etc.), polyethylene oxide, polyvinylpyrrolidone, polyvinyl methyl ether, polyacrylates, polyacrylamide, acrylic acid alkyl ester copolymers, and urethane copolymers.

Also, a hydrophilic low-molecular compound can be used instead of the hydrophilic polymer. Examples of the hydrophilic low-molecular compound can include, but are not particularly limited to, glycerin, erythritol, xylitol, sorbitol, galactitol, mannitol, ethylene glycol, diethylene glycol, propylene glycol, dipropylene glycol, and butylene glycol. For the addition of the hydrophilic polymer or the hydrophilic low-molecular compound, the amount of the hydrophilic polymer or the hydrophilic low-molecular compound added is not particularly limited and is preferably 1 to 200 parts by mass, more preferably 1 to 150 parts by mass, further preferably 2 to 120 parts by mass, particularly preferably 3 to 100 parts by mass, with respect to 100 parts by mass (solid content) of the ultrafine fiber.

The sheet can typically be prepared according to, for example, a papermaking method or a coating method described below without particular limitations.

<Papermaking Method>

The ultrafine fiber-containing slurry can be subjected to papermaking by a papermaking method known in the art such as a continuous paper machine (e.g., a Fourdrinier type, a cylinder type, or an inclined type) which is used in ordinary papermaking, a multilayer paper machine as a combination thereof, or hand papermaking, and formed into a sheet by the same method as in general paper. Specifically, the ultrafine fiber-containing slurry can be filtered and dehydrated on a wire to obtain a sheet in a wet paper state, followed by pressing and drying to obtain a sheet. The concentration of the slurry is not particularly limited and is preferably 0.05 to 5% by mass. Too low a concentration requires a huge amount of time for filtration. On the other hand, too high a concentration does not produce a homogeneous sheet and is therefore not preferred. For the filtration and dehydration of the slurry, the filter fabric for use in the filtration is not particularly limited, and it is important that the ultrafine fiber does not pass through the filter fabric and the filtration rate is not too slow. Such a filter fabric is not particularly limited and is preferably a sheet, a woven fabric, or a porous membrane made of an organic polymer. The organic polymer is not particularly limited and is preferably a non-cellulosic organic polymer such as polyethylene terephthalate, polyethylene, polypropylene, or polytetrafluoroethylene (PTFE). Specific examples thereof include, but are not particularly limited to, a porous membrane of polytetrafluoroethylene having a pore size of 0.1 to 20 μm, for example, 1 μm, and a woven fabric of polyethylene terephthalate or polyethylene having a pore size of 0.1 to 20 μm, for example, 1 μm.

Examples of the method for producing the sheet from the ultrafine fiber-containing slurry include, but are not particularly limited to, a method using a production apparatus described in WO2011/013567, comprising a dewatering section which ejects cellulose ultrafine fiber-containing slurry on the upper surface of an endless belt and squeezes the dispersion medium from the ejected slurry to generate a web, and a drying section which dries the web to form a fiber sheet, wherein the endless belt is disposed from the dewatering section through the drying section, and the web generated in the dewatering section is transported to the drying section while being placed on the endless belt.

Examples of the dehydration method that can be used in the present invention include, but are not particularly limited to, a dehydration method usually used for paper production. A method which involves dehydration with, for example, a Fourdrinier, cylinder, or inclined wire and then dehydration with a roll press is preferred. Examples of the drying method include, but are not particularly limited to, a method for use in paper production. For example, a method such as a cylinder dryer, a yankee dryer, hot air drying, or an infrared heater is preferred.

<Coating Method>

The coating method is a method which involves coating the ultrafine fiber-containing slurry on a base material, drying the resultant, and detaching the formed ultrafine fiber-containing layer from the base material to obtain a sheet. The method can continuously produce sheets by using a coating apparatus and a long base material. The property of the base material is not particularly limited, and a base material having higher wettability against the ultrafine fiber-containing slurry is more preferred because the contraction or the like of the sheet during drying can be suppressed. It is preferred to select a base material that allows the formed sheet to be easily detached after drying. Among others, a resin plate or a metal plate is preferred, though the base material is not particularly limited thereto. Such appropriate base materials are preferably used each alone or in a laminated form. Examples of the base material that can be used include, but are not particularly limited to: resin plates such as acrylic plates, polyethylene terephthalate plates, vinyl chloride plates, polystyrene plates, and polyvinylidene chloride plates; metal plates such as aluminum plates, zinc plates, copper plates, and iron plates; plates obtained by the oxidation treatment of their surface; and stainless plates and brass plates. Various coaters capable of coating a predetermined amount of the slurry on the base material can be used for coating the base material with the ultrafine fiber-containing slurry. For example, a roll coater, a gravure coater, a die coater, a curtain coater, a spray coater, a blade coater, a rod coater, or an air doctor coater can be used, though the coater is not particularly limited thereto. Among them, a coating manner such as a die coater, a curtain coater, a spray coater, or an air doctor coater is effective for uniform coating.

The drying method is not particularly limited, and any of a contactless drying method and a method of drying the sheet while locking the sheet can be used, or these methods may be combined.

The contactless drying method is not particularly limited, and a method for drying by heating with hot air, infrared radiation, far-infrared radiation, or near-infrared radiation (drying method by heating) or a method for drying in vacuum (vacuum drying method) can be utilized. Although the drying method by heating and the vacuum drying method may be combined, the drying method by heating is usually utilized. The drying with infrared radiation, far-infrared radiation, or near-infrared radiation can be performed using an infrared apparatus, a far-infrared apparatus, or a near-infrared apparatus without particular limitations. The heating temperature for the drying method by heating is not particularly limited and is preferably 40 to 120° C., more preferably 40 to 105° C. At the heating temperature equal to or higher than the lower limit described above, the dispersion medium can be rapidly volatilized. At the heating temperature equal to or lower than the upper limit described above, cost required for the heating can be reduced and the thermal discoloration of the ultrafine fiber can be suppressed.

The thickness of the ultrafine fiber-containing sheet is not particularly limited and is preferably 1 μm or larger, more preferably 5 μm or larger. Also, the thickness is usually 1000 μm or smaller, preferably 5 to 250 μm.

[Step (d)]

The step (d) is the step of eliminating the whole or a portion of introduced substituents from the sheet obtained in the step (c). In the present invention, after the sheet formation of the substituent-introduced ultrafine fiber produced by the preceding step, the substituent introduced in the ultrafine fiber contained in this sheet is eliminated. The elimination is carried out by treating the sheet obtained in the step (c) with water and/or an alcohol. The alcohol includes a polyhydric alcohol. In the case of using the polyhydric alcohol, the elimination can be achieved by boiling the sheet in the polyhydric alcohol and can also be achieved by treating the sheet with vapor of the polyhydric alcohol. In the case of using water and/or an alcohol having a low boiling point, the elimination can be achieved by treating the sheet with polyhydric alcohol vapor.

<Polyhydric Alcohol Boiling Method>

In a preferred aspect of the present invention, the elimination of the substituent in the step (d) is performed by the boiling treatment of the sheet with a polyhydric alcohol. The polyhydric alcohol refers to an alcohol having two or more OH groups. In the case of using the polyhydric alcohol, a polyhydric alcohol having an OH/C ratio of 0.15 or more is preferably used. More preferably, a polyhydric alcohol having an OH/C ratio of 0.2 or more is used. The "OH/C ratio" refers to the number of OH groups per carbon (C) atom contained in the molecule. For example, the OH/C ratio of ethylene glycol (C2H6O2) is 1, and the OH/C ratio of diethylene glycol (C4H10O3) is 0.67.

Examples of the polyhydric alcohol having an OH/C ratio of 0.2 or more include ethylene glycol, diethylene glycol, propylene glycol (1,2-propanediol), glycerin (glycerol and 1,2,3-propanetriol), pentanediol, octanediol, decanediol, and sugar alcohols (e.g., sorbitol, lactitol, maltitol, mannitol, and xylitol).

For the boiling treatment with the polyhydric alcohol, the amount of the polyhydric alcohol used in the step (d) is not particularly limited as long as the elimination of the substituent can be sufficiently carried out. This amount can be appropriately determined on the basis of the mass of the sheet. In the case of using any alcohol, for example, 1 to 100 parts by mass of the alcohol can be used with respect to 1 part by mass of the sheet. If the amount of the alcohol used with respect to 1 part by mass of the sheet is smaller than 1 part by mass, the elimination may not be sufficiently carried out.

For the boiling treatment with the polyhydric alcohol, the temperature at which the step (d) is carried out is not particularly limited as long as the elimination of the substituent can be sufficiently carried out. The temperature can be set to 140° C. or higher and is preferably 160° C. or higher, more preferably 170° C. or higher. However, it is preferred to select a temperature that prevents the decomposition of the fiber raw material. Such a temperature is not particularly limited and is 250° C. or lower, more preferably 200° C. or lower, for example, for use of cellulose as the fiber raw material. An additive such as an acid or a base may be appropriately added for the heating.

For the boiling treatment with the polyhydric alcohol, the time for which the step (d) is carried out is not particularly limited as long as the elimination of the substituent can be sufficiently carried out. In the case of using, for example, glycerin (polyhydric alcohol having an OH/C ratio of 1) as the alcohol and carrying out the step at 180° C., the time can be set to 10 to 120 minutes and is preferably 15 to 90 minutes, more preferably 15 to 60 minutes. The same holds true for use of other alcohols.

<Vapor Method>

For the elimination of the substituent in the step (d), vapor may be used. The type of the vapor is not particularly limited, and it is considered that the introduced substituent can be eliminated using vapor of any substance having an OH group. The vapor is preferably water vapor and/or vapor of an alcohol from the viewpoint of having the high ability to eliminate the substituent. Examples of the alcohol can include methanol, ethanol, n-propanol, isopropanol, n-butanol, isobutyl alcohol, and t-butanol, and the polyhydric alcohols mentioned above. One particularly preferred example of the vapor is water vapor. The water vapor may contain water and a lower alcohol (e.g., methanol, ethanol, and propanol), preferably an alcohol having 1 or more and 6 or less carbon atoms, more preferably 1 or more and 3 or less carbon atoms, a ketone having 3 or more and 6 or less carbon atoms (e.g., acetone, methyl ethyl ketone, and methyl isobutyl ketone), a linear or branched saturated or unsaturated hydrocarbon having 1 or more and 6 or less carbon atoms, and/or an aromatic hydrocarbon (e.g., benzene and toluene).

The treatment with vapor in the step (d) is not particularly limited and can be carried out by contacting the sheet with pressurized vapor (pressurized saturated vapor) or superheated vapor.

The treatment with pressurized vapor can employ, for example, an autoclave as in a conventional technique. A general autoclave has, for example, a cylindrical container and a cover which opens and closes the opening at the top of the container. The cover is provided with an exhaust port, a thermometer, and a pressure gauge, and a drain valve is disposed at the bottom of the container. When this autoclave is used, water is first placed in the container with the drain valve closed. The sheet is further placed above water in the container, which is then closed with the cover. Then, the exhaust port is opened. Upon heating of the container, the internal air of the container initially comes out of the exhaust port, and eventually, steam spouts. At the stage where the container is filled with water vapor, the exhaust port is closed. Then, the heating is continued while the temperature and the pressure are adjusted. After a lapse of a predetermined time, the heating is stopped. After cooling, the sheet is taken out of the container.

The treatment with pressurized vapor in the step (d) can be carried out in the temperature range of, for example, 100° C. to 250° C. The temperature can be set to 100° C. or higher and is preferably 120° C. or higher, more preferably 140° C. or higher, from the viewpoint of treatment efficiency. Also, the temperature can be set to 250° C. or lower and is preferably 200° C. or lower, more preferably 180° C. or lower, from the viewpoint of preventing the staining of the sheet.

The pressure of the treatment with pressurized vapor in the step (d) is preferably 0.1 MPa or higher, more preferably 0.5 MPa or higher, further preferably 0.8 MPa or higher. In any case, the pressure is preferably 30 MPa or lower, more preferably 25 MPa or lower, further preferably 20 MPa or lower, still further preferably 18 MPa or lower.

The time for the treatment with pressurized vapor in the step (d) differs depending on the temperature and the pressure, and the treatment can be carried out until the desired elimination can be achieved. The treatment time is, for example, 5 minutes or longer, preferably 10 minutes or longer, more preferably 30 minutes or longer. In any case, the treatment time can be set to 24 hours or shorter, preferably 10 hours or shorter, more preferably 3 hours or shorter. When the time to reach the heating temperature is defined as 0 hours, the treatment time refers to a time for which the heating temperature is maintained.

The treatment with superheated vapor can be carried out, for example, by spraying the superheated vapor to the sheet. The superheated vapor is sprayed in a supply range of, for example, 500 g/m$^3$ to 600 g/m$^3$ to the sheet from a nozzle. The temperature of the superheated vapor can be controlled at, for example, 100° C. to 160° C. at 1 atm. In this case, the supply time of the superheated vapor can be set to 4 seconds to 120 seconds.

The step (d) can be carried out until the introduced substituent is eliminated to the desired extent. The amount of the substituent after the elimination is not particularly limited and is, for example, 70% or less, preferably 50% or less, more preferably 30% or less, of the amount of the substituent introduced. Alternatively, the step (d) can be carried out until the amount of the substituent introduced in the sheet after the elimination reaches 0.7 mmol/g or smaller. The step (d) is preferably carried out until this amount reaches 0.5 mmol/g or smaller, more preferably 0.1 mmol/g or smaller, further preferably 0.05 mmol/g or smaller. When the sheet having a smaller substituent content is heated, yellowing or the like can be further suppressed. In the present invention, the term "amount of the substituent introduced" regarding the ultrafine fiber-containing sheet refers to a value measured by fluorescent X-ray analysis, unless otherwise specified. For the measurement, a sheet having a known amount of the substituent introduced is prepared, if necessary, and the characteristic X-ray intensity of an appropriate atom is plotted against the amount of the substituent introduced to prepare a calibration curve, which can then be used in the measurement. For the details of the measurement method, see the paragraphs of Examples in the present specification.

The elimination of the substituent suppresses staining resulting from high-temperature treatment. In addition, the sheet surface shifts toward hydrophobicity, and adhesion is also improved for composite formation with, for example, a hydrophobic resin.

In a particularly preferred aspect, the step (d) is performed by a treatment using high-pressure water vapor of 120° C. to 180° C. for 60 minutes to 360 minutes. Such a treatment can achieve elimination such that the amount of the functional group introduced is 0.3 mmol/g or smaller without impairing the appearance of the sheet.

Patent Literature 9 mentioned above relates to the heat treatment of cellulose oxide in the presence of water as a solvent and states that the solvent can be supplied not only as a liquid but as vapor. However, this technique is not aimed at eliminating the substituent. It is considered that the treatment described in this literature merely elutes mainly a carboxyl group that has entered the amorphous moiety of cellulose into high-temperature water. In fact, the substituent seems to be difficult to eliminate even if cellulose oxide is heat-treated in the presence of water. Furthermore, the heat treatment of Patent Literature 9 mentioned above also differs from the present invention in that the treatment is performed at a stage of fiber before sheet formation, not at a stage after sheet formation.

[Step (e)]

In one embodiment of the present invention, a phosphoric acid group is introduced as the substituent having electrostatic and/or steric functionality to the fiber raw material. In this case, the production method may further comprise, after the step (a) and before the step (c), the step of (e) changing the degree of neutralization of the substituent-introduced fiber or the substituent-introduced ultrafine fiber. The phosphoric acid group-introduced fiber usually has a degree of neutralization of 2 (also referred to as a degree of neutralization of 100%).

For example, in the case of introducing a phosphoric acid group to cellulose fiber using a sodium salt of phosphoric acid and performing alkali treatment with sodium hydroxide, a state having the degree of neutralization of 2 (the degree of neutralization of 100%) after the introduction is represented by cellulose-O—P(=O)(—O-Na+)(—O-Na+). A sheet prepared with the degree of neutralization of 2 (the degree of neutralization of 100%) unchanged has a slightly alkaline pH in the inside thereof. Thus, decomposition may occur from the end of cellulose in a high-temperature and humidity environment, generating a monosaccharide, which is a cause of staining. In a state having a degree of neutralization of 0 (a degree of neutralization of 0%) represented by cellulose-O—P(=O)(—O—H+)(—O—H+), a frame retardant mechanism unique to the phosphoric acid group emerges in a high-temperature and humidity environment, promoting char formation. This facilitates browning. Therefore, the internal pH of the sheet is rendered close to neutral or weakly acidic pH by changing the degree of neutralization. As a result, the decomposition and staining of cellulose in a high-temperature and humidity environment can be suppressed. Since the amount of the Na salt is also decreased, the swelling of the sheet by water can be suppressed. Thus, dimensional stability can be improved.

For eliminating the substituent using an alcohol in the step (d), a state is preferred where an electron pair on a hydroxy group carried by the alcohol easily nucleophilically attacks phosphorus of the phosphoric acid group. In the case of the degree of neutralization of 2 (the degree of neutralization of 100%), the phosphoric acid group is more strongly negatively charged and thus resists the nucleophilic attack. In the state having the degree of neutralization of 0 (the degree of neutralization of 0%) represented by cellulose-O—P(=O)(—O—H+)(—O—H+), the hydrogen bond between the phosphoric acid groups is strengthened and thus resists the nucleophilic attack. Therefore, the influence of the amount of negative charge of the phosphoric acid group and the hydrogen bond between the phosphoric acid groups can be reduced by changing the degree of neutralization. Thus, the eliminate efficiency of the substituent is improved. In the present specification, the case of using cellulose fiber as an example of the fiber may be described as an example. Those skilled in the art can understand the present invention by applying the description to the case of using other types of fibers.

The change of the degree of neutralization is not limited by the phosphoric acid group and can be similarly carried out even if a carboxyl group that exhibits weak acidity is introduced therein. However, as cellulose-O—COO$^-$Na$^+$ gets closer to cellulose-O—COO$^-$H$^+$ by changing the degree of neutralization, sufficient charge repulsion for stably dispersing nanofiber in water cannot be obtained so that aggregation or gelation occurs (see JP Patent Publication (Kokai) No. 2012-001626). Therefore, a sheet formed therefrom can no longer maintain its transparency. However, since the phosphoric acid group has lower pKa than that of the carboxyl group that exhibits weak acidity, aggregation or gelation is less likely to occur by changing the degree of neutralization. Thus, the resulting sheet maintains its transparency while staining is effectively suppressed.

Examples of the approach of changing the degree of neutralization in the step (e), but are not particularly limited to, an approach which involves preparing a suspension of the ultrafine fiber having the degree of neutralization of 2 (the degree of neutralization of 100%), followed by ion-exchange treatment. The ion-exchange treatment is also preferred because of sufficiently producing the effect of interest and being conveniently operated. For the ion-exchange treatment, a cation-exchange resin is used. A H+ ion is usually used as a counter ion. Ultrafine fiber having the degree of neutralization of 0 (the degree of neutralization of 0%) can be obtained by the treatment for a sufficient time using an appropriate amount of the cation-exchange resin. The obtained ultrafine fiber having the degree of neutralization of 0 (the degree of neutralization of 0%) and the ultrafine fiber having the unchanged degree of neutralization, i.e., the degree of neutralization 2 (the degree of neutralization of 100%), can be mixed at an appropriate ratio to obtain ultrafine fiber having varying degrees of neutralization from the degrees of neutralization of 0 (the degree of neutralization of 0%) to 2 (the degree of neutralization of 100%).

For the ion-exchange treatment, any of a strongly acidic ion-exchange resin and a weakly acidic ion-exchange resin can be used, and a strongly acidic ion-exchange resin is preferably used. Specifically, a styrenic resin or an acrylic resin having an introduced sulfonic acid group or carboxy group can be used. The shape of the ion-exchange resin is not particularly limited, and resins in various shapes such as fine granules (granular), membrane-like, fiber, or liquid forms can be used. A granular resin is preferred from the viewpoint of efficiently treating the ultrafine fiber suspension. Specific examples thereof include Amberjet 1020, Amberjet 1024, Amberjet 1060, and Amberjet 1220 (Organo Corp.), Amberlite IR-200C and Amberlite IR-120B (Tokyo Organic Chemical Ind., Ltd.), Lewatit SP 112 and Lewatit S100 (Bayer AG), GEL CKO8P (Mitsubishi Chemical Corp.), and Dowex 50W-X8 (The Dow Chemical Company), which are commercially available.

Specifically, the ion-exchange treatment is performed by mixing the granular ion-exchange resin with the fiber suspension (slurry), contacting the ion-exchange resin with the ultrafine fiber for a given time, if necessary, with stirring or shaking, and then separating between the ion-exchange resin and the slurry.

For the treatment with the ion-exchange resin, the concentration of the fiber suspension (slurry) or its ratio to the ion-exchange resin is not particularly limited. Those skilled in the art can appropriately design the concentration or the ratio from the viewpoint of efficiently carrying out ion exchange. A concentration that facilitates a treatment for sheet formation in subsequent steps may be used. Specifically, the concentration of the slurry is preferably 0.05 to 5% by mass. Too low a concentration requires much time for the treatment. On the other hand, too high a concentration does not produce adequate effects of ion exchange and is therefore not preferred.

In the case of using the slurry in such a concentration range and using, for example, a strongly acidic ion-exchange resin having an apparent density of 800 to 830 g/L-R, a moisture retention capacity of 36 to 55%, and a total exchange capacity of 1.8 eq/L-R, the ion-exchange resin can be used at 1/50 to 1/5 with respect to 1 by volume of the slurry. The treatment time is not particularly limited. Those skilled in the art can appropriately design the time from the viewpoint of efficiently carrying out ion exchange. For example, the treatment can be performed over 0.25 to 4 hours.

The step (e) can be carried out until the degree of neutralization is changed to the desired extent. As mentioned above, the degree of neutralization may be adjusted by mixing fiber having the degree of neutralization of 2 (the degree of neutralization of 100%) with fiber having the degree of neutralization of 0 (the degree of neutralization of 0%) at an appropriate ratio. In any case, the degree of neutralization can be set to 0 (the degree of neutralization of 0%) to 2 (the degree of neutralization of 100%) and is preferably 0.3 (the degree of neutralization of 15%) to 2 (the degree of neutralization of 100%), more preferably 0.3 (the degree of neutralization of 15%) to 1.7 (the degree of neutralization of 85%).

[Additional Step]

In the present invention, in addition to the steps (a) to (d) described above, the production method may appropriately have an additional step such as a washing step between the steps, before the step (a), or after the step (d), if necessary, without particular limitations. For example, a foreign matter removal step prior to the step (b) or a purification step by centrifugation or the like subsequent to the step (b) may be adopted without particular limitations. A desalting step is preferred from the viewpoint of enhancing the purity of the ultrafine fiber. In the case of carrying out the desalting step, examples of the approach thereof include, but are not particularly limited to, washing by a filtration manner, dialysis, and ion exchange. In a preferred aspect, a water washing step is carried out after the step (d). It is considered that the washing with water after the treatment with vapor in the step (d) can wash out the substituent eliminated by the vapor, etc., and thereby reduces the generation of a staining substance.

The method of Patent Literature 7 mentioned above eliminates the substituent from ultrafine fiber in a slurry state before preparation of a sheet. Therefore, dispersibility in water is deteriorated, and aggregation may occur. In such a case, a redispersion step can be further added. However, in the present invention, which involves eliminating the substituent after sheet formation, the substituent is maintained in water even without further adding this redispersion step. Therefore, the ultrafine fiber-dispersing effect of the substituent is sufficiently exerted.

[Ultrafine Fiber-Containing Sheet]

The ultrafine fiber-containing sheet that may be obtained by the aforementioned production method in such a way that the substituent has been eliminated until the amount of the substituent introduced has reached a given value or lower has high transparency in itself and reduced yellowing. Such a sheet is novel.

According to the studies of the present inventor, a hemiacetal or acetal structure is formed at the end of cellulose when the introduced substituent is eliminated after the sheet was formed from the substituent-introduced ultrafine fiber, by boiling treatment with a compound having an alcoholic hydroxy group (Japanese Patent Application No. 2014-107721 mentioned above, which had not yet been published at the time of filing of the present application). This structure exhibits resistance to the decomposition of cellulose called peeling reaction. Therefore, the generation of a cellulose decomposition product can be suppressed. As a result, a staining structure originated from the decomposition product can be prevented.

The ultrafine fiber-containing sheet that may be obtained by the production method comprising the step (e) in such a way that the degree of neutralization of the introduced phosphoric acid group has been adjusted has high transparency in itself and reduced yellowing. Such ultrafine fiber and an ultrafine fiber-containing sheet are also novel.

In the present invention, in relation to a particular production method, the term "ultrafine fiber-containing sheet produced" by the method includes not only a sheet produced by the production method but a sheet having the same structure as that of the sheet produced by the production method.

The novel ultrafine fiber-containing sheet provided by one aspect of the present invention contains cellulose ultrafine fiber having an introduced group and having an average fiber width of 2 to 1000 nm, the group being at least one group selected from the group consisting of a phosphoric acid-derived group, a carboxylic acid-derived group, and a sulfuric acid-derived group. The amount of the at least one group introduced, selected from the group consisting of a phosphoric acid-derived group, a carboxylic acid-derived group, and a sulfuric acid-derived group, in such a sheet is 0.7 mmol/g or smaller, preferably 0.5 mmol/g or smaller, more preferably 0.1 mmol/g or smaller, further preferably 0.047 mmol/g or smaller. The lower limit of the amount of the at least one group introduced, selected from the group consisting of a phosphoric acid-derived group, a carboxylic acid-derived group, and a sulfuric acid-derived group is not particularly limited and is, for example, 0.01 mmol/g or larger. In any case of the amount of the at least one group introduced, selected from the group consisting of a phosphoric acid-derived group, a carboxylic acid-derived group, and a sulfuric acid-derived group, the total light transmittance of the sheet itself is 88.5% or higher, preferably 89.7% or higher, more preferably 90.0% or higher.

The novel ultrafine fiber and ultrafine fiber-containing sheet provided by one aspect of the present invention have an introduced phosphoric acid group, have a changed degree of neutralization, and have an average fiber width of 2 to 1000 nm. The amount of the phosphoric acid group introduced in such ultrafine fiber or a sheet is 2.0 mmol/g or smaller, preferably 1.75 mmol/g or smaller, more preferably 1.6 mmol/g or smaller, further preferably 1.4 mmol/g or smaller. The lower limit of the amount of the phosphoric acid group introduced is not particularly limited. The lower limit can be set to 0.1 mmol/g or larger and may be set to 0.2 mmol/g or larger, 0.4 mmol/g or larger, or 0.6 mmol/g or larger. In the case of eliminating the substituent, the lower limit is not particularly limited and is, for example, 0.01 mmol/g or larger. In any case of the amount of the phosphoric acid group introduced, the total light transmittance of the sheet itself is 88.5% or higher, preferably 89.7% or higher, more preferably 90.0% or higher.

The novel ultrafine fiber-containing sheet provided by one aspect of the present invention has a high total light transmittance and suppressed yellowing. Specifically, the total light transmittance can be set to 85% or higher, preferably 90% or higher, for example, when cellulose ultrafine fiber having an ultrafine fiber average fiber width of 2 to 50 nm is contained therein, and the amount of the at least one group introduced, selected from the group consisting of a phosphoric acid-derived group, a carboxylic acid-derived group, and a sulfuric acid-derived group is 0.01 to 0.1 mmol/g. After heating of such a sheet at 200° C. in vacuum for 4 hours, the degree of yellowing of the sheet can be 30 or less. The degree of yellowing is preferably 27 or less, more preferably 9 or less, further preferably 5 or less. In the present invention, the term "yellowing" refers to a value obtained by measuring E313 yellowness index using a spectrophotometer according to the ASTM specification, unless otherwise specified. In the present invention, the term "total light transmittance" refers to a value measured according to JIS K7105, unless otherwise specified. The total light transmittance based on C light can be measured using a haze meter. The yellowing and the total light transmittance are measured not only for the ultrafine fiber-containing sheet but for a resin composite mentioned later. The aforementioned preferred ranges of the yellowing and the total light transmittance also hold true for the resin composite.

[Composite Formation, Etc.]

The ultrafine fiber-containing sheet provided by the present invention confers resistance to water (water proofness, moisture resistance, and water repellency). Therefore, an inorganic layer and/or an organic layer may be laminated thereon. The ultrafine fiber-containing sheet provided by the present invention has undergone the substituent elimination treatment and therefore has suppressed yellowing. Therefore, the laminating may involve a heating step or a UV irradiation step, which usually accelerates yellowing. Thus, various laminating approaches can be adopted. The composite sheet obtained by the laminating preferably comprises at least one inorganic layer and at least one organic layer formed on at least one side of a base sheet layer composed of the ultrafine fiber-containing sheet. In the case of laminating the inorganic layer and the organic layer thereon, the order is not particularly limited. It is preferred that the organic layer should be first laminated on the surface of the base sheet, because the face for forming the inorganic layer can be smoothened and the inorganic layer to be formed can have fewer defects. The composite sheet may also comprise an additional constituent layer other than the organic layer and the inorganic layer, for example, an easily adhesive layer for facilitating the adhesion of an upper layer.laminated The number of layers including the inorganic layer, the organic layer, etc., is not particularly limited. For example, 2 to 15 alternated layers of the inorganic layer and the organic layer are preferably laminated, and 3 to 7 alternated layers thereof are more preferably laminated, on one side from the viewpoint of attaining adequate moisture resistance while maintaining flexibility and transparency.

[Inorganic Layer]

The composite sheet according to one aspect of the present invention comprises an inorganic layer formed on at least one side of the base sheet layer. The inorganic layer may be formed on only one side of the base sheet layer or may be formed on both sides thereof. The inorganic layer may be formed in contact with the base sheet layer or may be formed such that another layer, for example, an organic layer mentioned later, is sandwiched between the inorganic layer and the base sheet layer. At least one inorganic layer can be formed, and a plurality of inorganic layers may be laminated.

<Material>

Examples of the substance constituting the inorganic layer include, but are not particularly limited to: aluminum, silicon, magnesium, zinc, tin, nickel, and titanium; their oxides, carbides, nitrides, oxycarbides, oxynitrides, and oxycarbonitrides; and mixtures thereof. Silicon oxide, silicon nitride, silicon oxycarbide, silicon oxynitride, silicon oxycarbonitride, aluminum oxide, aluminum nitride, aluminum oxycarbide, aluminum oxynitride, or a mixture thereof is preferred from the viewpoint that high moisture barrier properties can be stably maintained.

<Formation Method>

The method for forming the inorganic layer is not particularly limited. In general, methods for forming thin films are broadly classified into chemical vapor deposition (CVD) and physical vapor deposition (PVD), any of which can be applied to the present invention. Specific examples of the CVD method include plasma CVD which utilizes plasma, and catalytic CVD (Cat-CVD) which involves catalytically cracking material gas using a heated catalyzer. Specific examples of the PVD method include vacuum vapor deposition, ion plating, and sputtering.

On the other hand, atomic layer deposition (ALD) is a method for forming a thin film in an atomic layer unit by alternately supplying respective source gases of elements constituting the film to be formed to the face on which a layer is to be formed. This method, albeit disadvantageous in a slow deposition rate, can more smoothly cover even a face having a complicated shape than the plasma CVD method and has the advantage that a thin film having fewer defects can be formed. The ALD method also has the advantage that this method can control a film thickness at a nano order and can relatively easily cover a wide face, for example.

The ALD method can be further expected to improve a reaction rate, to achieve a low-temperature process, and to decrease unreacted gas, by using plasma.

The method for forming the inorganic layer for the present invention is preferably CVD, more preferably ALD, from the viewpoint of obtaining a homogeneous thin film having high gas barrier properties.

Those skilled in the art can appropriately design conditions for the formation of the inorganic layer. Various conditions can be adopted for the inorganic film formation without problems because the base sheet layer that has undergone the neutralization treatment in the step (e) or the elimination treatment in the step (d) as mentioned above has suppressed yellowing in a high-temperature and humidity environment. For example, in the case of imparting an inorganic layer of aluminum oxide to the base sheet layer that has undergone the substituent elimination treatment, trimethyl aluminum (TMA) as an aluminum source and $H_2O$ for the oxidation of TMA are used, and the chamber temperature can be set to 120 to 170° C. Also, the pulse time of TMA can be set to 0.05 to 2 seconds, and the purge time thereof can be set to 1 to 10 seconds. The pulse time of $H_2O$ can be set to 0.05 to 2 seconds, and the purge time thereof can be set to 1 to 10 seconds. This cycle can be repeated several tens to several hundreds of times to obtain a sheet with aluminum oxide films (film thickness: 10 to 60 nm) laminated on both sides of the sheet.

<Thickness>

The thickness of the inorganic layer is not particularly limited and is preferably 5 nm or larger, more preferably 10 nm or larger, further preferably 20 nm or larger, for exerting stable moisture barrier performance. The thickness of the inorganic layer is preferably 1000 nm or smaller, more preferably 800 nm or smaller, further preferably 600 nm or smaller, from the viewpoint of transparency and flexibility. The term "thickness" regarding the inorganic layer in the composite sheet of the present invention refers to the thickness of each individual inorganic layer for a plurality of inorganic layers disposed, unless otherwise specified.

[Organic Layer]

The composite sheet according to one aspect of the present invention may comprise an organic layer in addition to the base sheet layer and the inorganic layer. The organic layer may be formed on only one side of the base sheet layer or may be formed on both sides thereof. The organic layer may be formed in contact with the base sheet layer or may be formed such that another layer, for example, an inorganic layer, is sandwiched between the organic layer and the base sheet layer. Only one organic layer may be formed, and a plurality of organic layers may be laminated.

The organic layer can be formed by subjecting the base sheet layer, if necessary, to chemical modification treatment or hydrophobization treatment and then laminating a matrix resin thereon. The base sheet layer of the present invention has undergone the substituent elimination treatment or the like and therefore has suppressed yellowing at high temperature. Therefore, the formation of the organic layer may involve a heating step or a UV irradiation step, which usually accelerates yellowing. Thus, various formation approaches can be adopted.

<Matrix Resin Material>

The matrix resin is not particularly limited. For example, a thermoplastic resin, a thermosetting resin (a cured product obtained by the polymerization and curing of a thermosetting resin precursor by heating), or a photocurable resin (a cured product obtained by the polymerization and curing of a photocurable resin precursor by exposure to radiation (ultraviolet light, electron beam, etc.)) can be used. One of these matrix resins may be used, or two or more thereof may be used.

The thermoplastic resin is not particularly limited. Examples thereof include styrenic resins, acrylic resins, aromatic polycarbonate resins, aliphatic polycarbonate resins, aromatic polyester resins, aliphatic polyester resins, and aliphatic polyolefin resins. Further examples thereof include cyclic olefin resins, polyamide resins, polyphenylene ether resins, thermoplastic polyimide resins, polyacetal resins, polysulfone resins, and amorphous fluorine resins.

Examples of the thermosetting resin include, but are not particularly limited to, epoxy resins, acrylic resins, oxetane resins, phenol resins, urea resins, and melamine resins. Further examples thereof include unsaturated polyester resins, silicon resins, polyurethane resins, silsesquioxane resins, and diallyl phthalate resins.

Examples of the photocurable resins include, but are not particularly limited to, the epoxy resins, the acrylic resins, the silsesquioxane resins, and the oxetane resins listed as examples of the thermosetting resin mentioned above.

Specific examples of the thermoplastic resin, the thermosetting resin, or the photocurable resin further include those described in JP Patent Publication (Kokai) No. 2009-299043.

The matrix resin is preferably an amorphous synthetic polymer having a high glass transition temperature (Tg) from the viewpoint of obtaining a composite having excellent transparency and high durability. The amorphous level is preferably 10% or less, particularly preferably 5% or less, in terms of the degree of crystallinity. Tg is preferably 110° C. or higher, more preferably 120° C. or higher, particularly preferably 130° C. or higher. A matrix resin having low Tg might be deformed upon contact with, for example, hot water, and thus presents practical problems. The Tg of the matrix resin is determined by measurement according to DSC, and the degree of crystallinity can be calculated from the densities of an amorphous moiety and a crystalline moiety.

For obtaining a low-water-absorbing composite, it is preferred that the matrix resin should have a small content of a hydrophilic functional group such as a hydroxy group, a carboxyl group, or an amino group.

In a particularly preferred embodiment for the composite sheet having a laminated organic layer, polysilsesquioxane obtained by the cross-linking and curing of a silsesquioxane resin is used as the matrix resin. Examples of a commercially available silsesquioxane resin that can be used in this embodiment include OX-SQ TX-100, OX-SQ SI-20, OX-SQ ME-20, OX-SQ HDX, and AC-SQ TA-100. Further examples thereof include MAC-SQ TM-100, AC-SQ SI-20, MAC-SQ SI-20, and MAC-SQ HDM (all from Toagosei Co., Ltd.), and Konposeran SQ series (Arakawa Chemical Industries, Ltd.). For the cross-linking of the silsesquioxane resin, a thiol group-containing silsesquioxane compound can be used. Examples of a commercially available thiol group-containing silsesquioxane compound that can be used in this embodiment include Konposeran HBSQ series (Arakawa Chemical Industries, Ltd.).

In another preferred embodiment, a urethane acrylate resin composition which is three-dimensionally cured rapidly by radical polymerization when irradiated with electron beam or ultraviolet light may be used as the matrix resin. Examples of a commercially available urethane acrylate resin that can be used in this embodiment include Beamset 575CB (Arakawa Chemical Industries, Ltd.). Methyl ethyl ketone can be used in the cross-linking. The formed resin layer has favorable chemical resistance and surface curability and is therefore suitable for preparing a composite sheet having large surface hardness by further staking the resin layer on the inorganic layer.

<Thickness>

The thickness of the organic layer is not particularly limited and is preferably a level that sufficiently imparts moisture resistance to the base sheet layer and does not impair the advantage of low linear thermal expansion of the sheet. The thickness can be set to, for example, approximately 0.1 to 50 μm and may be set to 0.1 to 30 μm, 0.2 to 20 or 0.5 to 10 μm. The term "thickness" regarding the organic layer in the composite sheet of the present invention refers to the thickness of each individual organic layer for a plurality of organic layers disposed, unless otherwise specified.

<Method for Laminating Matrix Resin>

Examples of the method for laminating the matrix resin include, but are not particularly limited to, the following methods:

(A) a method which involves alternately disposing thermoplastic resin sheets and base sheet layers and sticking these sheets together by hot press or the like;

(B) a method which involves applying one or more precursors selected from a thermoplastic resin precursor, a thermosetting resin precursor, and a photocurable resin precursor in a liquid state on one side or both sides of a base sheet or on one side or both sides of an inorganic layer laminated on the base sheet, followed by polymerization and curing; and (C) a method which involves applying a resin solution on one side or both sides of a base sheet or on one side or both sides of an inorganic layer laminated on the base sheet, and removing the solvent, followed by polymerization and curing, if desired. In this context, the resin solution is a solution containing one or more solutes selected from a thermoplastic resin, a thermoplastic resin precursor, a thermosetting resin precursor, and a photocurable resin precursor.

Examples of the method (A) include a method which involves disposing a thermoplastic resin film or sheet on one side or both sides of a base sheet or on one side or both sides of an inorganic layer laminated on the base sheet, and laminating the thermoplastic resin and the base sheet layer by heating or pressing, if desired. In this case, the lamination may be performed by applying an adhesive, a primer, or the like to the surface of the base sheet layer. For the lamination, a method of passing through between two pressurized rolls or a method of pressing in vacuum can be used so as not to get air bubbles therein.

Examples of the method (B) include a method which involves applying a thermosetting resin precursor formulated with a thermal polymerization initiator on one side or both sides of a base sheet layer, and curing the precursor by heating so that the resin and the base sheet layer are stuck together. Another example thereof includes a method which involves applying a photocurable resin precursor formulated with a photopolymerization initiator on one side or both sides of a base sheet layer, and curing the precursor by exposure to radiation such as ultraviolet light.

Alternatively, a thermosetting or photocurable resin precursor may be applied to a base sheet layer, and then, another base sheet layer can be laminated thereon, for example, to form a multilayer structure, followed by curing.

Examples of the method (C) include a method which involves preparing a resin solution containing a soluble resin dissolved in a solvent, applying the resin solution on one side or both sides of a base sheet layer, and removing the solvent by heating. In the case of the photocurable resin, polymerization and curing are further carried out using radiation or the like, if desired.

The solvent for dissolving the resin can be selected according to the solubility of the resin.

<Curable Composition>

The thermoplastic resin precursor, the thermosetting resin precursor, and the photocurable resin precursor described above may each be appropriately supplemented with a chain transfer agent, an ultraviolet absorber, a filler other than cellulose, or a silane coupling agent, etc., to prepare a composition (hereinafter, also referred to as a "curable composition").

The curable composition containing the chain transfer agent can allow the reaction to proceed homogeneously. For example, a polyfunctional mercaptan compound having two or more thiol groups in the molecule can be used as the chain transfer agent. Moderate tenacity can be imparted to a cured product by using the polyfunctional mercaptan compound.

The mercaptan compound is not particularly limited. Examples thereof include pentaerythritol tetrakis(β-thiopropionate), trimethylolpropane tris(β-thiopropionate), and tris[2-(β-thiopropionyloxyethoxy)ethyl]triisocyanurate. One or two or more of these compounds are preferably used.

When the curable composition contains the chain transfer agent, the chain transfer agent is usually contained at a proportion of 30% by mass or smaller with respect to the total of radical polymerizable compounds in the curable composition.

The curable composition containing the ultraviolet absorber can prevent staining. The ultraviolet absorber is selected from, for example, a benzophenone ultraviolet absorber and a benzotriazole ultraviolet absorber. One type of ultraviolet absorber may be used, or two or more types thereof may be used in combination.

When the curable composition contains the ultraviolet absorber, the ultraviolet absorber is usually contained at a proportion of 0.01 to 1 parts by mass with respect to 100 parts by mass in total of radical polymerizable compounds in the curable composition.

Examples of the filler include, but are not particularly limited to, inorganic particles and organic polymers. Specific examples thereof include inorganic particles such as silica particles, titania particles, and alumina particles. Further examples thereof include particles of a transparent cycloolefin polymer such as Zeonex (Zeon Corp.) or Arton (JSR Corp.), and particles of a general-purpose thermoplastic polymer such as polycarbonate or polymethyl methacrylate. Among others, nano-size silica particles are preferably used because transparency can be maintained. Also, particles of a polymer structurally similar to an ultraviolet curable monomer are preferably used as the filler because the polymer can be dissolved into a high concentration.

Examples of the silane coupling agent include, but are not particularly limited to, γ-((meth)acryloxypropyl)trimethoxysilane and γ-((meth)acryloxypropyl)methyldimethoxysilane. Further examples thereof include γ-((meth)acryloxypropyl)methyldiethoxysilane, γ-((meth)acryloxypropyl)triethoxysilane, and γ-(acryloxypropyl)trimethoxysilane. These compounds have a (meth)acrylic group in their molecules and are preferred because they can be copolymerized with other monomers.

When the curable composition contains the silane coupling agent, the silane coupling agent is usually contained at 0.1 to 50% by mass, preferably 1 to 20% by mass, with respect to the total of radical polymerizable compounds in the curable composition. If this content is too small, effects brought about by the silane coupling agents contained therein cannot be sufficiently obtained. If the content is too large, the optical properties such as transparency of a cured product might be impaired.

<Curing Method>

The curable composition can be polymerized and cured by a curing method known in the art to prepare a cured product.

Examples of the curing method include thermal curing and radiation curing. Radiation curing is preferred. Examples of the radiation include infrared radiation, visible light, ultraviolet light, and electron beam. A light which is an electromagnetic wave having a wavelength of 1 to 1000 nm is preferred. An electromagnetic wave having a wavelength of approximately 200 to 450 nm is more preferred. Ultraviolet light having a wavelength of 300 to 400 nm is further preferred.

Specific examples of the method for curing the curable composition include a method which involves adding in advance a thermal polymerization initiator which generates a radical or an acid by heating to the curable composition, and polymerizing the curable composition by heating (hereinafter, also referred to as "thermal polymerization"), a method which involves adding in advance a photopolymerization initiator which generates a radical or an acid by radiation such as ultraviolet light to the curable composition, and polymerizing the curable composition by exposure to radiation (preferably, light) (hereinafter, also referred to as "photopolymerization"), and a method which involves adding in advance both of the thermal polymerization initiator and the photopolymerization initiator to the curable composition and polymerizing the curable composition by the combination of heat and light.

For the polymerization and curing by exposure to radiation, the dose of the radiation is any dose in a range that allows the photopolymerization initiator to generate a radical. However, since polymerization is incomplete at an exceedingly low dose of radiation, the resulting cured product does not sufficiently exert its heat resistance or mechanical properties. On the other hand, an exceedingly high dose of radiation causes light-induced deterioration such as yellowing in the cured product. Therefore, the curable composition is irradiated with 300 to 450 nm of ultraviolet light, preferably in the range of 0.1 to 200 J/cm$^2$, more preferably in the range of 1 to 20 J/cm$^2$, according to the composition of monomers and the type and amount of the photopolymerization initiator.

Further preferably, the curable composition is irradiated with two or more divided portions of radiation. Specifically, the first exposure to approximately ½₀ to ⅓ of the total radiation dose and the second or later exposure to the remaining necessary amount yield a cured product having smaller birefringence.

Specific examples of the lamp for use in the exposure to radiation can include metal halide lamps, high-pressure mercury lamps, ultraviolet LED lamps, and electrodeless mercury lamps.

In order to quickly complete the polymerization and curing, the photopolymerization and the thermal polymerization may be carried out at the same time. In this case, the curable composition is cured by heating in the range of 30 to 300° C. at the same time with exposure to radiation. Also in order to complete the polymerization, a thermal polymerization initiator may be added to the curable composition. However, the addition thereof in a large amount brings about increase in the birefringence of the cured product and deterioration in its hue. Therefore, the amount of the thermal polymerization initiator added is preferably 0.1 to 2% by mass, more preferably 0.3 to 1% by mass, with respect to the total of curable monomer components.

Examples of the thermal polymerization initiator used in the thermal polymerization include hydroperoxide, dialkyl peroxide, peroxyester, diacyl peroxide, peroxycarbonate, peroxyketal, and ketone peroxide. Specifically, benzoyl peroxide, diisopropyl peroxycarbonate, t-butylperoxy(2-ethylhexanoato)dicumyl peroxide, di-t-butyl peroxide, t-butyl peroxybenzoate, t-butyl hydroperoxide, diisopropyl benzene hydroperoxide, or 1,1,3,3-tetramethylbutyl hydroperoxide, or the like can be used. These polymerization initiators may each be used alone, or two or more thereof may be used in combination.

If the thermal polymerization is started during irradiation with light, the polymerization is difficult to control. Therefore, the 1-min half-life temperature of the thermal polymerization initiator is preferably 120° C. or higher and 300° C. or lower.

A photo-radical generator or a cationic photopolymerization initiator is usually used as the photopolymerization initiator for use in the photopolymerization. These photopolymerization initiators may each be used alone, or two or more thereof may be used in combination.

A compound known in the art to be available for this purpose can be used as the photo-radical generator. Examples thereof include benzophenone, benzoin methyl ether, benzoin propyl ether, diethoxyacetophenone, 1-hydroxycyclohexyl phenyl ketone, 2,6-dimethylbenzoyl diphenylphosphine oxide, and 2,4,6-trimethylbenzoyl diphenylphosphine oxide. Among them, benzophenone or 2,4,6-trimethylbenzoyl diphenylphosphine oxide is preferred.

The cationic photopolymerization initiator is a compound that initiates cationic polymerization by exposure to radiation such as ultraviolet light or electron beam. Examples thereof include the following.

Examples of aromatic sulfonium salts include bis[4-(diphenylsulfonio)phenyl]sulfide bishexafluorophosphate, bis[4-(diphenylsulfonio)phenyl]sulfide bishexafluoroantimonate, bis[4-(diphenylsulfonio)phenyl]sulfide bishexafluoroborate, bis[4-(diphenylsulfonio)phenyl]sulfide tetrakis(pentafluorophenyl)borate, diphenyl-4-(phenylthio)phenylsulfonium hexafluoro, diphenyl-4-(phenylthio)phenylsulfonium hexafluoroantimonate, diphenyl-4-(phenylthio)phenylsulfonium tetrafluoroborate, diphenyl-4-(phenylthio)phenylsulfonium tetrakis(pentafluorophenyl)borate, triphenylsulfonium hexafluorophosphate, triphenylsulfonium hexafluoroantimonate, triphenylsulfonium tetrafluoroborate, triphenylsulfonium tetrakis(pentafluorophenyl)borate, bis[4-(di(4-(2-hydroxyethoxy))phenylsulfonio)phenyl]sulfide bishexafluorophosphate, bis[4-(di(4-(2-hydroxyethoxy))phenylsulfonio)phenyl]sulfide bishexafluoroantimonate, bis[4-(di(4-(2-hydroxyethoxy))phenylsulfonio)phenyl]sulfide tetrafluoroborate, and bis[4-(di(4-(2-hydroxyethoxy))phenylsulfonio)phenyl]sulfide tetrakis(pentafluorophenyl)borate.

Examples of aromatic iodonium salts include diphenyliodonium hexafluorophosphate, diphenyliodonium hexafluoroantimonate, diphenyliodonium tetrafluoroborate, diphenyliodonium tetrakis(pentafluorophenyl)borate, bis(dodecylphenyl)iodonium hexafluoroantimonate, bis(dodecylphenyl)iodonium tetrakis(pentafluorophenyl)borate, 4-methylphenyl-4-(1-methylethyl)phenyliodonium hexafluorophosphate, 4-methylphenyl-4-(1-methylethyl)phenyliodonium hexafluoroantimonate, 4-methylphenyl-4-(1-methylethyl)phenyliodonium hexafluoroborate, and 4-methylphenyl-4-(1-methylethyl)phenyliodonium tetrakis(pentafluorophenyl)borate.

Examples of aromatic diazonium salts include phenyldiazonium hexafluorophosphate, phenyldiazonium hexafluoroantimonate, diphenyliodonium tetrafluoroborate, and diphenyliodonium tetrakis(pentafluorophenyl)borate.

Examples of aromatic ammonium salts include 1-benzyl-2-cyanopyridinium hexafluorophosphate, 1-benzyl-2-cyanopyridinium hexafluoroantimonate, 1-benzyl-2-cyanopyridinium tetrafluoroborate, 1-benzyl-2-cyanopyridinium tetrakis(pentafluorophenyl)borate, 1-(naphthylmethyl)-2-cyanopyridinium hexafluorophosphate, 1-(naphthylmethyl)-2-cyanopyridinium hexafluoroantimonate, 1-(naphthylmethyl)-2-cyanopyridinium tetrafluoroborate, and 1-(naphthylmethyl)-2-cyanopyridinium tetrakis(pentafluorophenyl)borate. Examples of (2,4-cyclopentadien-1-yl) [(1-methylethyl)benzene]-iron salts include (2,4-cyclopentadien-1-yl)[(1-methylethyl)benzene]-iron(II) hexafluorophosphate, (2,4-cyclopentadien-1-yl)[(1-methylethyl)benzene]-iron(II) hexafluoroantimonate, (2,4-cyclopentadien-1-yl)[(1-methylethyl)benzene]-iron(II) tetrafluoroborate, and (2,4-cyclopentadien-1-yl)[(1-methylethyl)benzene]-iron(II) tetrakis(pentafluorophenyl)borate.

Examples of commercially available products of these cationic photopolymerization initiators include UVI6990 and UVI6979 manufactured by Union Carbide Corp., SP-150, SP-170, and SP-172 manufactured by ADEKA Corp., Irgacure 261 and Irgacure 250 manufactured by Ciba-Geigy Japan Ltd., RHODORSIL PI2074 and JMF-2456 manufactured by Rhodia Japan Co., Ltd., and San-Aid SI-60L, SI-80L, SI-100L, SI-110L, SI-180L, and SI-100L manufactured by Sanshin Chemical Industry Co., Ltd.

In addition to the cationic photopolymerization initiator, a curing agent may be further added for curing cationic polymerizable monomers. Examples of the curing agent include: compounds such as amine compounds and polyaminoamide compounds synthesized from the amine compounds; and tertiary amine compounds, imidazole compounds, hydrazide compounds, melamine compounds, acid anhydrides, phenol compounds, thermally latent cationic polymerization catalysts, and dicyanamide, and derivatives thereof. These curing agents may each be used alone, or two or more thereof may be used in combination. Among them, examples of the thermally latent cationic polymerization catalysts include Adeka Opton CP-66 and CP-77 (manufactured by ADEKA Corp.), and San-Aid SI-15, SI-20, SI-25, SI-40, SI-45, SI-47, SI-60, SI-80, SI-100, SI-100L, SI-110L, SI-145, SI-150, SI-160, and SI-180L (manufactured by Sanshin Chemical Industry Co., Ltd.).

Also, a photosensitizer can be added. Specific examples thereof include pyrene, perylene, acridine orange, thioxanthone, 2-chlorothioxanthone, and benzoflavine. Examples of a commercially available photosensitizer include Adeka Iptomer SP-100 (manufactured by ADEKA Corp.).

The amount of the component used as the photopolymerization initiator is preferably 0.001 parts by mass or larger, more preferably 0.01 parts by mass or larger, further preferably 0.05 parts by mass or larger, with respect to 100 parts by mass in total of polymerizable compounds in the curable composition. Also, the amount of the component used as the photopolymerization initiator is preferably 5 parts by mass or smaller, more preferably 2 parts by mass or smaller, further preferably 0.1 parts by mass or smaller. Specifically, the range of the amount of the component used as the photopolymerization initiator is preferably 0.001 to 5 parts by mass, more preferably 0.01 to 2 parts by mass, further preferably 0.05 to 0.1 parts by mass, with respect to 100 parts by mass in total of polymerizable compounds in the curable composition.

When the photopolymerization initiator is a cationic photopolymerization initiator, its amount is 0.01 parts by mass or larger with respect to 100 parts by mass in total of cationic polymerizable monomers. The amount is preferably 0.1 parts by mass or larger, more preferably 0.5 parts by mass or larger and is usually 10 parts by mass or smaller, preferably 5 parts by mass or smaller, more preferably 1 part by mass or smaller.

Specifically, when the photopolymerization initiator is a cationic photopolymerization initiator, the range of the amount of the component used as the photopolymerization initiator is preferably 0.01 to 10 parts by mass, more preferably 0.1 to 5 parts by mass, further preferably 0.5 to 1 parts by mass, with respect to 100 parts by mass in total of cationic polymerizable monomers.

If the amount of the photopolymerization initiator added is too large, the polymerization proceeds abruptly. Thus, not only is the birefringence of the resulting cured product increased, but its hue is deteriorated. When the photopolymerization initiator has a concentration of, for example, 5 parts by mass, ultraviolet light cannot reach a side opposite to its irradiation due to the absorption of the photopolymerization initiator so that an uncured portion remains. In addition, the resulting cured product is stained yellowish, and its hue is significantly deteriorated. On the other hand, if the amount of the photopolymerization initiator added is too small, the polymerization might not sufficiently proceed even under irradiation with ultraviolet light.

<Chemical Modification Treatment at Stage Prior to Resin Composite Formation>

In the case of laminating the organic layer on the base sheet, the base sheet layer can be subjected to chemical modification treatment before the laminating of the matrix resin in order to improve adhesion to the resin.

The chemical modification involves reacting a chemical modifier with a hydroxy group in cellulose to add thereto a functional group containing the structure of the chemical modifier.

The modification method is not particularly limited and includes a method which involves reacting a chemical modifier as listed below with cellulose fiber. The conditions for this reaction are not particularly limited. If desired, a solvent or a catalyst, etc., may be used, and heating or reduction in pressure, etc., may be carried out.

Examples of the type of the chemical modifier include one or two or more substances selected from the group consisting of an acid, an acid anhydride, an alcohol, a halogenation reagent, isocyanate, alkoxysilane, alkoxysiloxane, silazane, and a cyclic ether such as oxirane (epoxy).

Examples of the acid include acetic acid, acrylic acid, methacrylic acid, propanoic acid, butanoic acid, 2-butanoic acid, and pentanoic acid.

Examples of the acid anhydride include acetic anhydride, acrylic anhydride, methacrylic anhydride, propanoic anhydride, butanoic anhydride, 2-butanoic anhydride, and pentanoic anhydride.

Examples of the halogenation reagent include acetyl halide, acryloyl halide, methacryloyl halide, propanoyl halide, butanoyl halide, 2-butanoyl halide, pentanoyl halide, benzoyl halide, and naphthoyl halide.

Examples of the alcohol include methanol, ethanol, propanol, and 2-propanol.

Examples of the isocyanate include methyl isocyanate, ethyl isocyanate, and propyl isocyanate.

Examples of the alkoxysilane include methoxysilane and ethoxysilane.

Examples of the alkoxysiloxane include butoxypolydimethylsiloxane.

Examples of the silazane include hexamethyldisilazane, tetramethyldisilazane, and diphenyltetramethyldisilazane.

Examples of the cyclic ether such as oxirane (epoxy) include ethyloxirane and ethyloxetane.

Among them, acetic anhydride, acrylic anhydride, methacrylic anhydride, benzoyl halide, naphthoyl halide, methoxysilane, or hexamethyldisilazane is particularly preferred.

One of these chemical modifiers may be used alone, or two or more thereof may be used in combination.

A basic catalyst such as pyridine, triethylamine, sodium hydroxide, or sodium acetate, or an acidic catalyst such as acetic acid, sulfuric acid, or perchloric acid is preferably used as the catalyst.

The temperature conditions for the chemical modification are preferably 10 to 250° C. because too high a temperature might cause yellowing of cellulose, reduction in the degree of polymerization, etc. whereas too low a temperature decreases a reaction rate. The reaction time is usually several minutes to several tens of hours, though differing depending on the chemical modifier or a chemical modification rate.

In the present invention, the chemical modification rate of cellulose is usually 65 mol % or less, preferably 50 mol % or less, more preferably 40 mol % or less, with respect to all of the hydroxy groups of cellulose. There is no particular lower limit to the chemical modification rate.

The chemical modification elevates the decomposition temperature of cellulose and enhances heat resistance. However, at too high a chemical modification rate, the cellulose structure is destroyed to reduce crystallinity. This tends to increase a linear thermal expansion coefficient and is therefore not preferred for a composite mentioned later.

In this context, the chemical modification rate is the ratio of a chemically modified hydroxy group to all of the hydroxy groups of cellulose. The chemical modification rate can be determined by IR, NMR, or a titration method, etc. For example, the chemical modification rate of cellulose ester based on the titration method can be determined according to the description of Patent Literature 4 mentioned above.

In the case of chemically modifying the base sheet layer, it is preferred to thoroughly wash the base sheet layer after the chemical modification, for terminating the reaction. If an unreacted chemical modifier remains, this chemical modifier residue is responsible for later staining or presents problems with composite formation with the resin and is therefore not preferred. After the thorough washing, replacement with an organic solvent such as an alcohol is preferably further performed. In this case, the base sheet layer can be dipped in the organic solvent such as an alcohol for easy replacement.

In the case of chemically modifying the base sheet layer, the base sheet layer thus chemically modified is usually dried. This drying may be air-blow drying, may be drying under reduced pressure, may be press drying, or may be drying by heating.

When heating is carried out during the drying, the temperature is preferably 50° C. or higher, more preferably 80° C. or higher, and is preferably 250° C. or lower, more preferably 150° C. or lower.

Specifically, the range of the temperature for heating during the drying is preferably 50 to 250° C., more preferably 80 to 150° C.

Too low a heating temperature might require much time for the drying or result in insufficient drying. Too high a heating temperature might cause staining or decomposition of the base sheet layer.

For the pressing, the pressure (gauge pressure) is preferably 0.01 MPa or higher, more preferably 0.1 MPa or higher, and is preferably 5 MPa or lower, more preferably 1 MPa or lower.

Specifically, the range of the pressure (gauge pressure) for the pressing is preferably 0.01 to 5 MPa, more preferably 0.1 to 1 MPa.

Too low a pressure might result in insufficient drying. Too high a pressure might cause crushing or decomposition of the base sheet layer.

[Composite Sheet]

The composite sheet obtained by the present invention can have a total light transmittance, a haze, a yellowness, a linear thermal expansion coefficient, and a water vapor transmission rate, etc., which are preferred properties as an optical material. Methods for measuring these properties and their preferred ranges will be described below.

<Total Light Transmittance>

The term "total light transmittance (%)" according to the present invention refers to a value measured using a haze meter and C light according to JIS K7105, unless otherwise specified.

By the configuration of the present invention, the composite sheet that has flexibility and a low linear thermal expansion coefficient and is further provided with moisture resistance can have a total light transmittance of 80% or more. In a preferred aspect, the total light transmittance can be 82% or more. In a more preferred aspect, the total light transmittance can be 85% or more. In a further preferred aspect, the total light transmittance can be 90% or more.

<Haze>

The term "haze value" according to the present invention refers to a value measured using a haze meter and C light according to JIS K7136, unless otherwise specified. The haze is an index for the transparency of the sheet and represents turbidity (opacity). The haze is determined from the percentage of a diffusely transmitted light to all transmitted lights and can also be influenced by surface roughness.

By the configuration of the present invention, the composite sheet that has flexibility and a low linear thermal expansion coefficient and is further provided with moisture resistance can have a haze value of 2 or lower. In a preferred aspect, the haze value can be 1.2 or lower. In a more preferred aspect, the haze value can be 1.0 or lower.

<Yellowness>

The term "yellowness" according to the present invention refers to a value obtained by measuring the E313 yellowness index (YI) of the target sheet using an appropriate spectrophotometer (SpectroEye) according to the ASTM specification, unless otherwise specified. The yellowness can be determined from the difference in measured YI between before and after heating at 200° C. in vacuum for 4 hours.

By the configuration of the present invention, the composite sheet can have a yellowness (YI) of 23 or lower after heating. In a preferred aspect, the yellowness (YI) can be 12 or lower. In a more preferred aspect, the yellowness (YI) can be 8 or lower. By the configuration of the present invention, the composite sheet can also have change in yellowness between before and after heating (AYI) of 17 or lower. In a preferred aspect, the AYI can be 5 or lower. In a more preferred aspect, the AYI can be 3 or lower.

<Linear Thermal Expansion Coefficient>

The term "linear thermal expansion coefficient" according to the present invention refers to a value determined as follows, unless otherwise specified. The target sheet is cut into 3 mm wide×30 mm long using a laser cutter. The temperature of this cut piece is increased from room temperature to 180° C. at a rate of 5° C./min, decreased from 180° C. to 25° C. at a rate of 5° C./min, and increased from 25° C. to 180° C. at a rate of 5° C./min, at an interchuck interval of 20 mm and a load of 10 g in a nitrogen atmosphere. The linear thermal expansion coefficient is determined from the measurement values at 60° C. to 100° C. at the time of the second increase in temperature.

By the configuration of the present invention, the composite sheet can have a linear thermal expansion coefficient of 18 or lower. In a preferred aspect, the linear thermal expansion coefficient can be 15 or lower. In a more preferred aspect, the linear thermal expansion coefficient can be 10 or lower.

<Humidity Expansion Coefficient>

The term "humidity expansion coefficient" according to the present invention refers to a value determined under conditions described in Examples of the present specification using an appropriate humidity expansion and contraction apparatus, unless otherwise specified.

By the configuration of the present invention, the composite sheet that has high transparency, flexibility, and a low linear thermal expansion coefficient can have a humidity expansion coefficient of 50 or lower. In a preferred aspect, the humidity expansion coefficient can be 40 or lower. In a more preferred aspect, the humidity expansion coefficient can be 20 or lower.

<Water Vapor Transmission Rate>

The term "water vapor transmission rate ($g/m^2 \cdot day$)" according to the present invention refers to a value measured at a temperature of 40° C. in a 90% RH atmosphere using an appropriate water vapor transmission rate measurement apparatus according to JIS K7129, unless otherwise specified.

By the configuration of the present invention, the composite sheet that has high transparency, flexibility, and a low linear thermal expansion coefficient can have a water vapor transmission rate of 800 $g/m^2 \cdot day$ or lower. In a preferred aspect, the water vapor transmission rate can be 400 $g/m^2 \cdot day$ or lower. In a more preferred aspect, the water vapor transmission rate can be 200 $g/m^2 \cdot day$ or lower.

<Others>

By the configuration of the present invention, the obtained composite sheet can also be excellent in surface roughness, surface hardness, a bending test (mandrel method), etc. The testing methods therefor are well-known to those skilled in the art.

[Purpose of Composite Sheet]

In an embodiment of the present invention, the obtained composite sheet has suppressed yellowing and improved moisture resistance while exploiting the properties of the ultrafine fiber-containing sheet having transparency, a high modulus of elasticity, and a low linear thermal expansion coefficient. Such a composite sheet is excellent in optical properties and is therefore suitable for use as a display element, a lighting element, a solar cell, or a window material, or a panel or a substrate therefor.

More specifically, the composite sheet is suitable for use as display such as a flexible display, a touch panel, a liquid crystal display, a plasma display, an organic EL display, a field emission display or a display for rear-projection television, or a LED element. Also, the composite sheet is suitable for use as a substrate for solar cells such as silicon solar cells and dye-sensitized solar cells. For purposes as the substrate, a barrier film, ITO, TFT, or the like may be laminated thereon. Furthermore, the composite sheet is suitable for use as a window material for automobiles, rail vehicles, aircrafts, houses, office buildings, factories, and the like. For the window material, a film such as a fluorine coating or a hard coat film, or an impact-resistant or light-resistant material may be laminated thereon, if necessary.

The composite sheet can also be used as a structural material for purposes other than transparent materials by exploiting properties such as a low linear expansion rate, high elasticity, high strength, and a light weight. Particularly, the composite sheet can be preferably used as a material for automobiles, rail vehicles, or aircrafts, such as glazing, an interior material, an outer panel, or a bumper, a case for personal computers, a component for home electronics, a material for packaging, a building material, a construction material, a fishery material, other industrial materials, and the like.

The composite sheet provided according to an embodiment of the present invention can be used in various products. Examples of the product can include various products such as: computers, tablet terminals, and mobile phones using the display elements or the displays mentioned above; electric bulbs, lightings (lighting devices and lighting apparatuses), guidance lights, backlights for liquid crystal panels, flashlights, headlamps for bicycles, interior lights and meter lamps for automobiles, traffic light machines, altitude lightings within or without buildings, home lightings, school lightings, medical lightings, factory lightings, lights for plant growth, illumination for video lightings, lightings for around-the-clock or late-night shops such as convenience stores, and illuminating lamps for refrigerators or freezers using the lighting elements; and houses, buildings, automobiles, rail vehicles, aircrafts, and home electronics using the window materials or the structural materials.

Hereinafter, the present invention will be described with reference to Examples. However, the scope of the present invention is not intended to be limited by Examples.

EXAMPLES

Example 1

<Preparation of Phosphoric Acid-Modified Cellulose Fiber>

1000 g (absolute dry mass) of unbeaten softwood kraft pulp (manufactured by Oji Paper Co., Ltd.) was impregnated with a chemical consisting of urea, sodium phosphate (molar ratio of a phosphorus atom and a sodium atom: Na/P=1.45), and water and compressed so that a redundant chemical was squeezed out to obtain chemical-impregnated pulp. The chemical-impregnated pulp contained 1000 g (absolute dry mass) of the pulp, 950 g of urea, 400 g (as weight of the phosphorus atom) of sodium phosphate, and 1200 g of water. The chemical-impregnated pulp was dried and heat-treated in an oven heated to 150° C. to introduce the phosphoric acid group to the pulp. 25 L of ion-exchange water was poured to the chemical-impregnated pulp after the drying and heating steps, which was then uniformly dispersed by stirring, followed by filtration and dehydration to obtain a dehydrated sheet. This step was repeated twice. Subsequently, the obtained dehydrated sheet was diluted with 25 L of ion-exchange water, and a 1 N aqueous sodium hydroxide solution was added thereto in small portions with stirring to obtain pulp slurry having a pH of 11 to 13. Then, this pulp slurry was dehydrated to obtain a dehydrated sheet.

Then, 25 L of ion-exchange water was poured again to the dehydrated sheet, which was then uniformly dispersed by stirring, followed by filtration and dehydration to obtain a dehydrated sheet. This step was repeated twice to obtain phosphoric acid-modified cellulose fiber.

<Machine Process>

After washing and dehydration, ion-exchange water was added to the obtained pulp to prepare a pulp suspension having a concentration of 1.0% by mass. This pulp suspension was passed through a high-pressure homogenizer (manufactured by GEA Niro Soavi Company; Panda Plus 2000) five times at an operating pressure of 1200 bar to obtain an ultrafine fiber-form cellulose suspension. The suspension was further passed through a wet atomization apparatus (manufactured by Sugino Machine Ltd.; Ultimizer) five times at a pressure of 245 MPa to obtain an ultrafine fiber-form cellulose suspension (1). The ultrafine fiber-form cellulose had an average fiber width of 4.2 nm.

<Sheet Formation>

Polyethylene glycol (manufactured by Wako Pure Chemical Industries, Ltd.; molecular weight: 4,000,000) was added to the ultrafine fiber-form cellulose suspension (1) so as to be 15 parts by mass with respect to 100 parts by mass of the ultrafine fiber-form cellulose. The concentration was adjusted to 0.5% by mass in terms of solid concentration. The suspension was measured such that the finished basis weight of a nonwoven fabric was 37.5 g/m2. The suspension was developed to a commercially available acrylic plate and dried in an oven of 50° C. A plate for damming was disposed on the acrylic plate so as to achieve the predetermined basis weight and to obtain a square nonwoven fabric. The nonwoven fabric was obtained by these procedures. The obtained nonwoven fabric had a thickness of 25 μm and a density of 1.49 g/cm$^3$.

<Substituent Elimination Treatment>

A heat-resistant rubber sheet (manufactured by Shin-Etsu Chemical Co., Ltd., X-30-4084-U) with a hole of 100 mmϕ made therein was placed as a spacer on a stainless plate, and 11 mL of ethylene glycol was developed into the hole. The nonwoven fabric cut into 5 cm square was dipped therein, and another stainless plate was layered thereon. The resultant was loaded in a hot press machine (manufactured by Imoto Machinery Co., Ltd.; manual hydraulic vacuum heating press) heated to 180° C. For substituent elimination treatment, the nonwoven fabric was treated at 180° C. for 15 minutes. Then, the nonwoven fabric was dipped in 30 mL of methanol for washing. The washing was repeated three times, and the nonwoven fabric was attached to glass and dried by heating at 100° C. for 5 minutes to obtain a nonwoven fabric.

Example 2

A nonwoven fabric was obtained in the same way as in Example 1 except that the solvent for the substituent elimination treatment was changed to diethylene glycol.

Example 3

A nonwoven fabric was obtained in the same way as in Example 1 except that the solvent for the substituent elimination treatment was changed to propylene glycol.

Example 4

A nonwoven fabric was obtained in the same way as in Example 1 except that the solvent for the substituent elimination treatment was changed to pentanediol.

Example 5

A nonwoven fabric was obtained in the same way as in Example 1 except that the solvent for the substituent elimination treatment was changed to octanediol.

Example 6

A nonwoven fabric was obtained in the same way as in Example 1 except that the solvent for the substituent elimination treatment was changed to decanediol.

Example 7

A nonwoven fabric was obtained in the same way as in Example 1 except that the solvent for the substituent elimination treatment was changed to sorbitol.

Example 8

A nonwoven fabric was obtained in the same way as in Example 1 except that the solvent for the substituent elimination treatment was changed to glycerin.

Example 9

A strongly acidic ion-exchange resin (manufactured by Organo Corp.; Amberjet 1024) was added at a volume ratio of 1/10 to the ultrafine fiber-form cellulose suspension (1) obtained in the same way as in Example 1, followed by shake treatment for 1 hour. Then, the suspension was poured to a mesh having an opening of 90 μm so that the slurry was separated from the resin to obtain an ultrafine fiber-form cellulose suspension (2).

The ultrafine fiber-form cellulose suspension (1) and the ultrafine fiber-form cellulose suspension (2) were mixed at a volume ratio of 75:25 to prepare an ultrafine fiber-form cellulose suspension (3). A nonwoven fabric was prepared in the same way as in Example 8 using this suspension as a raw material. Then, substituent elimination treatment was carried out to obtain a nonwoven fabric.

Example 10

A nonwoven fabric was obtained in the same way as in Example 9 except that the mixing ratio of the ultrafine fiber-form cellulose suspension (1) and the ultrafine fiber-form cellulose suspension (2) was changed to 50:50.

Example 11

A nonwoven fabric was obtained in the same way as in Example 9 except that the mixing ratio of the ultrafine fiber-form cellulose suspension (1) and the ultrafine fiber-form cellulose suspension (2) was changed to 25:75.

Example 12

A nonwoven fabric was obtained in the same way as in Example 9 except that the mixing ratio of the ultrafine fiber-form cellulose suspension (1) and the ultrafine fiber-form cellulose suspension (2) was changed to 0:100.

Example 13

A nonwoven fabric was obtained in the same way as in Example 8 except that the substituent elimination conditions were changed to 220° C. and 30 minutes.

Example 14

A nonwoven fabric was obtained in the same way as in Example 8 except that the substituent elimination treatment time was changed to 30 minutes.

Example 15

A nonwoven fabric was obtained in the same way as in Example 14 except that the substituent elimination treatment temperature was changed to 140° C.

Example 16

A nonwoven fabric was obtained in the same way as in Example 8 except that the substituent elimination treatment time was changed to 60 minutes.

Example 17

A nonwoven fabric was obtained in the same way as in Example 8 except that the substituent elimination treatment time was changed to 180 minutes.

Example 18

Leaf bleached kraft pulp (LBKP) was dried at 105° C. for 3 hours to obtain dried pulp having a moisture content of 3% by mass or smaller. Subsequently, 4 g of the dried pulp and 4 g of maleic anhydride (100 parts by mass with respect to 100 parts by mass of the dried pulp) were charged into an autoclave and treated at 150° C. for 2 hours. Subsequently, the maleic anhydride-treated pulp was washed with 500 mL of water three times. Then, ion-exchange water was added thereto to prepare 490 mL of slurry. Subsequently, 10 mL of a 4 N aqueous sodium hydroxide solution was added in small portions to the slurry with stirring so that the pH of the slurry was adjusted to 12 to 13 for the alkali treatment of the pulp. Then, the pulp thus alkali-treated was washed with water until the pH reached 8 or lower. After washing and dehydration, ion-exchange water was added to the obtained pulp to prepare a pulp suspension having a concentration of 1.0% by mass. This pulp suspension was passed through a high-pressure homogenizer (manufactured by GEA Niro Soavi Company; Panda Plus 2000) five times at an operating pressure of 1200 bar to obtain an ultrafine fiber-form cellulose suspension. The suspension was further passed through a wet atomization apparatus (manufactured by Sugino Machine Ltd.; Ultimizer) five times at a pressure of 245 MPa to obtain an ultrafine fiber-form cellulose suspension (4). A nonwoven fabric was prepared in the same way as in Example 8 using the ultrafine fiber-form cellulose suspension (4) as a raw material. Then, substituent elimination treatment was carried out to obtain a nonwoven fabric.

Example 19

The nonwoven fabric obtained in Example 8 was used as a base material, and resin layers were laminated on both sides of the base material by the following procedures: 26 parts by weight of a silsesquioxane resin ("Konposeran SQ107" manufactured by Arakawa Chemical Industries, Ltd.), 14 parts by weight of a curing agent ("HBSQ201" manufactured by Arakawa Chemical Industries, Ltd.), and 60 parts by weight of isopropyl alcohol were mixed to obtain a coating solution. Subsequently, one side of the base material was coated with the coating solution using a Meyer bar. Then, the coating solution was dried at 100° C. for 3 minutes and then cured by irradiation with ultraviolet light of 300 mJ/cm$^2$ using a UV conveyor apparatus ("ECS-4011GX" manufactured by Eye Graphics Co., Ltd.) to form a resin layer having a thickness of 5 μm. Another resin layer having a thickness of 5 μm was formed on the other side by the same procedures as above to obtain a composite of the base material and the resin.

Example 20

A resin composite was obtained by the same procedures as in Example 19 except that the base material was changed to the nonwoven fabric obtained in Example 10.

Comparative Example 1

A nonwoven fabric was obtained in the same way as in Example 1 except that the substituent elimination treatment was not carried out.

Comparative Example 2

A nonwoven fabric was obtained in the same way as in Example 1 except that the solvent for the substituent elimination treatment was changed to water.

Comparative Example 3

A nonwoven fabric was obtained in the same way as in Example 18 except that the substituent elimination treatment was not carried out.

Comparative Example 4

A nonwoven fabric was obtained in the same way as in Example 18 except that the solvent for the substituent elimination treatment was changed to water.

Comparative Example 5

26 parts by weight of a silsesquioxane resin ("Konposeran SQ107" manufactured by Arakawa Chemical Industries, Ltd.), 14 parts by weight of a curing agent ("HBSQ201" manufactured by Arakawa Chemical Industries, Ltd.), and 60 parts by weight of isopropyl alcohol were mixed. Then, the mixed solution was developed to a commercially available acrylic plate by calculation such that the thickness was 35 Then, the solution was dried at 100° C. for 3 minutes and then cured by irradiation with ultraviolet light of 300 mJ/cm$^2$ using a UV conveyor apparatus ("ECS-4011GX" manufactured by Eye Graphics Co., Ltd.) to obtain a resin sheet.

[Evaluation]
<Method>

The nonwoven fabrics prepared in Examples 1 to 18 and Comparative Examples 1 to 4 were evaluated according to evaluation methods given below. Also, the composite sheets of Examples 19 and 20 and Comparative Example 5 were evaluated.

(1) Total Light Transmittance

The total light transmittance was measured using a haze meter (manufactured by Suga Test Instruments Co., Ltd.) and C light according to JIS K7105.

(2) Yellowness

Each obtained nonwoven fabric was heated at 200° C. in vacuum for 4 hours. Then, its E313 yellowness index was measured using a handy spectrophotometer manufactured by GretagMacbeth GmbH (SpectroEye) according to the ASTM specification.

(3) Amount of Phosphoric Acid Group and Amount of Carboxyl Group

The phosphorus and sodium atom concentrations in each nonwoven fabric were measured by fluorescent X-ray analysis. Specifically, the characteristic X-ray intensity of a phosphorus or sodium atom released when an outer electron was transferred to a vacancy resulting from the excitation of the core electron of the phosphorus or sodium atom by the irradiation of the nonwoven fabric with X rays was measured to obtain the concentration of the phosphorus or sodium atom.

The measurement conditions are as described below.

Analysis apparatus: fluorescent X-ray analysis apparatus (XRF) PW-2404 manufactured by Spectris
Measurement sample: round sample having a diameter of 27 mm
X-ray tube: Rh tube
Target: rhodium
Dispersive crystal: Ge111 (phosphorus), PX1 (sodium)
Excitation light energy: 32 kV-125 mA
Measurement line: phosphorus P-Kα1, sodium Na-Kα1
2θ angle peak: 141.112 (phosphorus), 28.020 (sodium)
Measurement time: 54 seconds (phosphorus), 50 seconds (sodium)

Figure 2:
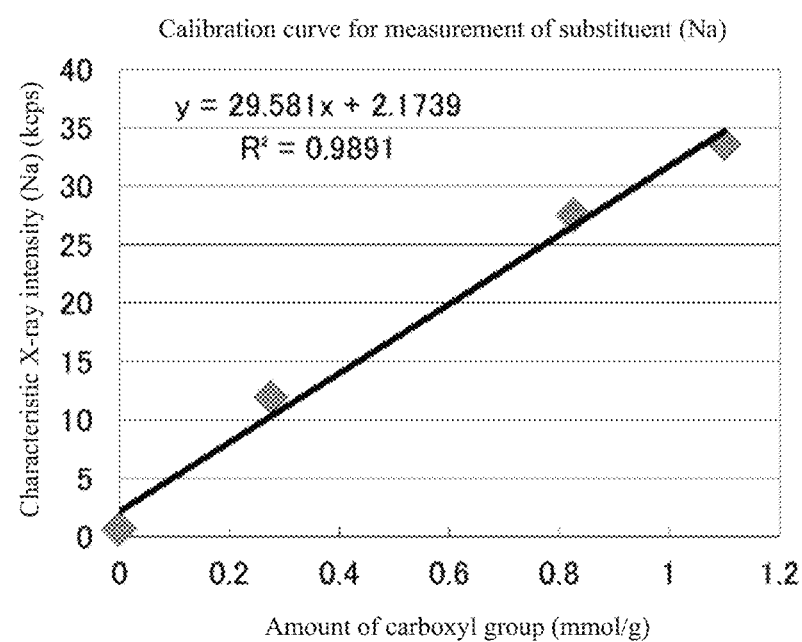
FIG. 2 shows a calibration curve for an ultrafine fiber-containing sheet. A nonwoven fabric having a Na salt form of a known carboxyl group was prepared. A calibration curve of the characteristic X-ray intensity of a Na atom vs. the amount of the carboxyl group introduced was prepared and subjected to an experiment.

The amounts of the substituent introduced before and after the solvent treatment were calculated from a calibration curve prepared by the following method: a nonwoven fabric having a known amount of a phosphoric acid group was prepared. After implementation of fluorescent X-ray analysis, a calibration curve of the characteristic X-ray intensity of a P atom vs. the amount of the phosphoric acid group introduced was prepared (FIG. 1). As for a carboxyl group, a nonwoven fabric having a Na salt form of a known carboxyl group was similarly prepared. A calibration curve of the characteristic X-ray intensity of a Na atom vs. the amount of the carboxyl group introduced was prepared (FIG. 2).

(4) Haze

The haze value was measured using a haze meter manufactured by Suga Test Instruments Co., Ltd. and C light according to JIS K7136.

(5) Linear Thermal Expansion Coefficient

Each obtained composite was cut into 3 mm wide×30 mm long using a laser cutter. The temperature of this cut piece was increased from room temperature to 180° C. at a rate of 5° C./min, decreased from 180° C. to 25° C. at a rate of 5° C./min, and increased from 25° C. to 180° C. at a rate of 5° C./min, at an interchuck interval of 20 mm and a load of 10 g in a nitrogen atmosphere using TMA120 manufactured by Seiko Instruments Inc. (SIT) on a tensile mode. The linear thermal expansion coefficient was determined from the measurement values at 60° C. to 100° C. at the time of the second increase in temperature.

<Results>

The results are shown in Tables 1 and 2.

TABLE 1

| | | Amount of | | | | | | | Element concentration [kcps] | |
| --- | --- | --- | --- | --- | --- | --- | --- | --- | --- | --- |
| | Substituent | substituent introduced [mmol/g] | Degree of neutralization (%) | Solvent name | OH/C ratio [—] | Treatment temperature [° C.] | Treatment time [min] | Element species | Before solvent treatment | After solvent treatment |
| Example 1 | Phosphoric acid group | 0.743 | 100 | Ethylene glycol | 1.00 | 180 | 15 | P | 180.5 | 32.2 |
| Example 2 | Phosphoric acid group | 0.743 | 100 | Diethylene glycol | 0.50 | 180 | 15 | P | 180.5 | 110.0 |
| Example 3 | Phosphoric acid group | 0.743 | 100 | Propylene glycol | 0.67 | 180 | 15 | P | 180.5 | 96.4 |
| Example 4 | Phosphoric acid group | 0.743 | 100 | Pentanediol | 0.40 | 180 | 15 | P | 180.5 | 141.6 |
| Example 5 | Phosphoric acid group | 0.743 | 100 | Octanediol | 0.25 | 180 | 15 | P | 180.5 | 167.1 |
| Example 6 | Phosphoric acid group | 0.743 | 100 | Decanediol | 0.20 | 180 | 15 | P | 180.5 | 164.9 |
| Example 7 | Phosphoric acid group | 0.743 | 100 | Sorbitol | 1.00 | 180 | 15 | P | 180.5 | 8.1 |
| Example 8 | Phosphoric acid group | 0.743 | 100 | Glycerin | 1.00 | 180 | 15 | P | 180.5 | 15.1 |
| Example 9 | Phosphoric acid group | 0.743 | 75 | Glycerin | 1.00 | 180 | 15 | P | 180.5 | 10.3 |
| Example 10 | Phosphoric acid group | 0.743 | 50 | Glycerin | 1.00 | 180 | 15 | P | 180.5 | 7.6 |
| Example 11 | Phosphoric acid group | 0.743 | 25 | Glycerin | 1.00 | 180 | 15 | P | 180.5 | 13.0 |
| Example 12 | Phosphoric acid group | 0.743 | 0 | Glycerin | 1.00 | 180 | 15 | P | 180.5 | 24.7 |
| Example 13 | Phosphoric acid group | 0.743 | 100 | Glycerin | 1.00 | 220 | 30 | P | 180.5 | 3.7 |
| Example 14 | Phosphoric acid group | 0.743 | 100 | Glycerin | 1.00 | 180 | 30 | P | 180.5 | 6.9 |
| Example 15 | Phosphoric acid group | 0.743 | 100 | Glycerin | 1.00 | 140 | 30 | P | 180.5 | 95.8 |
| Example 16 | Phosphoric acid group | 0.743 | 100 | Glycerin | 1.00 | 180 | 60 | P | 180.5 | 4.4 |

TABLE 1-continued

| | | | | | | | | | | |
|---|---|---|---|---|---|---|---|---|---|---|
| Example 17 | Phosphoric acid group | 0.743 | 100 | Glycerin | 1.00 | 180 | 180 | P | 180.5 | 4.1 |
| Example 18 | Carboxyl group | 0.512 | 100 | Glycerin | 1.00 | 180 | 15 | Na | 17.3 | 1.0 |
| Comparative Example 1 | Phosphoric acid group | 0.743 | 100 | — | — | — | — | P | 180.5 | 180.5 |
| Comparative Example 2 | Phosphoric acid group | 0.743 | 100 | Water | — | 180 | 15 | P | 180.5 | Immeasurable due to disruption of sample during deesterification treatment |
| Comparative Example 3 | Carboxyl group | 0.512 | 100 | — | — | — | — | Na | 17.3 | 17.3 |
| Comparative Example 4 | Carboxyl group | 0.512 | 100 | Water | — | 180 | 15 | Na | — | Immeasurable due to disruption of sample during deesterification treatment |

| | Amount of substituent introduced after solvent treatment [mmol/g] | Total light transmittance [%] | | Yellowness (YI value) | |
|---|---|---|---|---|---|
| | | Before solvent treatment | After solvent treatment | Before vacuum heating | After vacuum heating |
| Example 1 | 0.128 | 91.5 | 90.2 | 4.2 | 9.6 |
| Example 2 | 0.451 | 91.5 | 90.2 | 5.7 | 20.7 |
| Example 3 | 0.394 | 91.5 | 90.9 | 4.6 | 21.2 |
| Example 4 | 0.582 | 91.5 | 90.2 | 3.3 | 22.6 |
| Example 5 | 0.688 | 91.5 | 90.7 | 4.6 | 26.8 |
| Example 6 | 0.679 | 91.5 | 90.5 | 3.9 | 20.3 |
| Example 7 | 0.028 | 91.5 | 90.4 | 6.5 | 7.7 |
| Example 8 | 0.057 | 91.5 | 90.9 | 5.2 | 8.6 |
| Example 9 | 0.037 | 91.5 | 91.2 | 1.9 | 4.3 |
| Example 10 | 0.026 | 91.5 | 91.1 | 2.8 | 3.2 |
| Example 11 | 0.049 | 91.5 | 90.4 | 1.0 | 9.7 |
| Example 12 | 0.097 | 91.5 | 90.7 | 0.9 | 17.2 |
| Example 13 | 0.010 | 91.5 | 90.6 | 8.7 | 9.7 |
| Example 14 | 0.023 | 91.5 | 90.8 | 3.8 | 6.0 |
| Example 15 | 0.392 | 91.5 | 90.8 | 2.1 | 16.6 |
| Example 16 | 0.013 | 91.5 | 91.0 | 6.1 | 6.7 |
| Example 17 | 0.011 | 91.5 | 91.0 | 7.9 | 8.2 |
| Example 18 | 0.031 | 90.4 | 90.1 | 4.6 | 12.3 |
| Comparative Example 1 | 0.743 | 91.5 | 91.5 | 1.9 | 30.2 |
| Comparative Example 2 | — | 91.5 | Immeasurable due to disruption of sample during deesterification treatment | | |
| Comparative Example 3 | 0.515 | 90.4 | — | 1.6 | 19.9 |
| Comparative Example 4 | — | 90.4 | Immeasurable due to disruption of sample during deesterification treatment | | |

TABLE 2

| | Base sheet | Resin | Thickness [μm] (resin/base sheet/resin) | Total light transmittance [%] | Haze [%] | Yellowness (YI value) | | Linear thermal expansion coefficient [ppm/K] |
|---|---|---|---|---|---|---|---|---|
| | | | | | | Before vacuum heating | After vacuum heating | |
| Example 19 | Example 8 | Polysilsesquioxane | 5/25/5 | 91.5 | 0.7 | 5.1 | 8.9 | 12.1 |
| Example 20 | Example 10 | Polysilsesquioxane | 5/25/5 | 91.6 | 0.7 | 3.1 | 5.0 | 11.1 |
| Comparative Example 5 | — | Polysilsesquioxane | 35 | 91.3 | 0.5 | — | — | 139.1 |

When the substituent elimination treatment was not carried out, the yellowness values of the phosphoric acid group-introduced ultrafine fiber-containing sheet and the carboxyl group-introduced ultrafine fiber-containing sheet after vacuum heating were 30.2 and 19.9, respectively. On the other hand, yellowing was suppressed by the substituent elimination treatment with a polyhydric alcohol.

Figure 3:
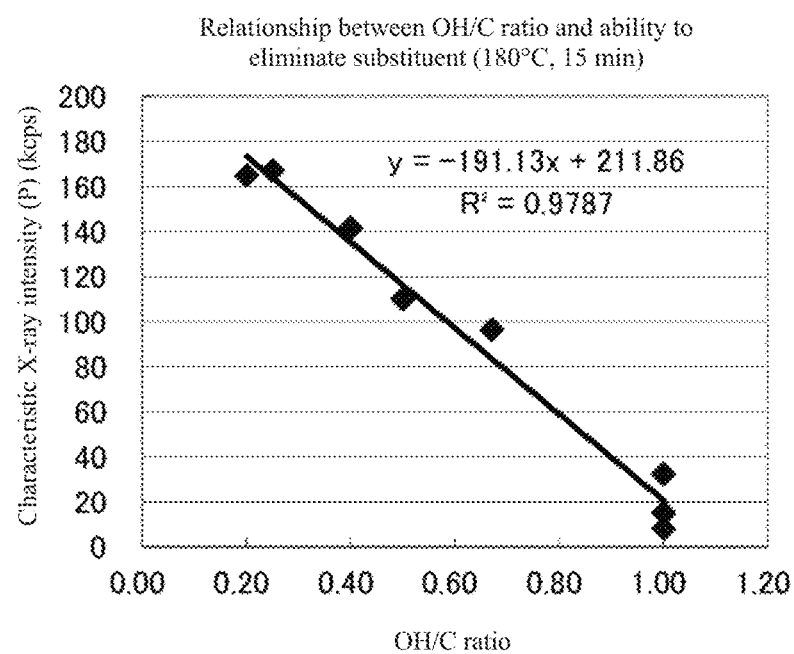
FIG. 3 shows the relationship between an OH/C ratio and the ability to eliminate the substituent.

From the results of Examples 1 to 8, a correlation diagram was prepared as to the relationship between an OH/C ratio and the ability to eliminate the substituent. As a result, the correlation therebetween was revealed (FIG. 3). An OH/C ratio of 0.2 or more was found preferable for eliminating 10% or more of introduced ester groups.

As further seen from the results of Examples 8 to 12, the substituent elimination was facilitated by changing the degree of neutralization to 25% to 75%. Thus, yellowing after heating was remarkably suppressed.

From the results of Examples 19 and 20, almost no change was observed in total light transmittance and yellowness between before and after resin composite formation. By the formation of a resin composite, the obtained resin composite was found to have suppressed yellowing and improved moisture resistance while exploiting the properties of the ultrafine fiber-containing sheet having transparency, a high modulus of elasticity, a low linear thermal expansion coefficient, and flexibility Example 21

<Preparation of Phosphoric Acid-Modified Cellulose Fiber>

1000 g (absolute dry mass) of unbeaten softwood kraft pulp (manufactured by Oji Paper Co., Ltd.) was impregnated with a chemical consisting of urea, sodium phosphate (molar ratio of a phosphorus atom and a sodium atom: Na/P=1.45), and water and compressed so that a redundant chemical was squeezed out to obtain chemical-impregnated pulp. The chemical-impregnated pulp contained 1000 g (absolute dry mass) of the pulp, 950 g of urea, 400 g (as weight of the phosphorus atom) of sodium phosphate, and 1200 g of water. The chemical-impregnated pulp was dried and heat-treated in an oven heated to 150° C. to introduce the phosphoric acid group to the pulp. 25 L of ion-exchange water was poured to the chemical-impregnated pulp after the drying and heating steps, which was then uniformly dispersed by stirring, followed by filtration and dehydration to obtain a dehydrated sheet. This step was repeated twice. Subsequently, the obtained dehydrated sheet was diluted with 25 L of ion-exchange water, and a 1 N aqueous sodium hydroxide solution was added thereto in small portions with stirring to obtain pulp slurry having a pH of 11 to 13. Then, this pulp slurry was dehydrated to obtain a dehydrated sheet. Then, 25 L of ion-exchange water was poured again to the dehydrated sheet, which was then uniformly dispersed by stirring, followed by filtration and dehydration to obtain a dehydrated sheet. This step was repeated twice to obtain phosphoric acid-modified cellulose fiber.

<Machine Process>

After washing and dehydration, ion-exchange water was added to the obtained pulp to prepare a pulp suspension having a concentration of 1.0% by mass. This pulp suspension was passed through a high-pressure homogenizer (manufactured by GEA Niro Soavi Company; Panda Plus 2000) five times at an operating pressure of 1200 bar to obtain an ultrafine fiber-form cellulose suspension. The suspension was further passed through a wet atomization apparatus (manufactured by Sugino Machine Ltd.; Ultimizer) five times at a pressure of 245 MPa to obtain an ultrafine fiber-form cellulose suspension (1). The ultrafine fiber-form cellulose had an average fiber width of 4.2 nm.

<Sheet Formation>

Polyethylene glycol (manufactured by Wako Pure Chemical Industries, Ltd.; molecular weight: 4,000,000) was added to the ultrafine fiber-form cellulose suspension (1) so as to be 15 parts by mass with respect to 100 parts by mass of the ultrafine fiber-form cellulose. The concentration was adjusted to 0.5% by mass in terms of solid concentration. The suspension was measured such that the finished basis weight of a nonwoven fabric was 45 g/m2. The suspension was developed to a commercially available acrylic plate and dried in an oven of 50° C. A plate for damming was disposed on the acrylic plate so as to achieve the predetermined basis weight and to obtain a square nonwoven fabric. The nonwoven fabric was obtained by these procedures. The obtained nonwoven fabric had a thickness of 30 μm.

<Substituent Elimination Treatment>

The nonwoven fabric cut into 10 cm square was placed on a glass plate, and high-pressure vapor treatment was carried out at 120° C. for 120 minutes using an autoclave (ES-315 manufactured by Tomy Seiko Co., Ltd.). Then, the nonwoven fabric was dipped in 150 mL of deionized water for washing. The washing was repeated three times, and the nonwoven fabric was attached to glass and dried at room temperature for 24 hours to obtain a nonwoven fabric.

Example 22

A nonwoven fabric was obtained in the same way as in Example 21 except that the high-pressure vapor treatment was carried out at 120° C. for 240 minutes.

Example 23

A nonwoven fabric was obtained in the same way as in Example 21 except that the high-pressure vapor treatment was carried out at 120° C. for 360 minutes.

Example 24

A nonwoven fabric was obtained in the same way as in Example 21 except that the high-pressure vapor treatment was carried out at 130° C. for 240 minutes.

Example 25

Leaf bleached kraft pulp (LBKP) was dried at 105° C. for 3 hours to obtain dried pulp having a moisture content of 3% by mass or smaller. Subsequently, 4 g of the dried pulp and 4 g of maleic anhydride (100 parts by mass with respect to 100 parts by mass of the dried pulp) were charged into an autoclave and treated at 150° C. for 2 hours. Subsequently, the maleic anhydride-treated pulp was washed with 500 mL of water three times. Then, ion-exchange water was added thereto to prepare 490 mL of slurry. Subsequently, 10 mL of a 4 N aqueous sodium hydroxide solution was added in small portions to the slurry with stirring so that the pH of the slurry was adjusted to 12 to 13 for the alkali treatment of the pulp. Then, the pulp thus alkali-treated was washed with water until the pH reached 8 or lower. After washing and dehydration, ion-exchange water was added to the obtained pulp to prepare a pulp suspension having a concentration of 1.0% by mass. This pulp suspension was passed through a high-pressure homogenizer (manufactured by GEA Niro Soavi Company; Panda Plus 2000) five times at an operating pressure of 1200 bar to obtain an ultrafine fiber-form cellulose suspension. The suspension was further passed through a wet atomization apparatus (manufactured by Sugino Machine Ltd.; Ultimizer) five times at a pressure of 245 MPa to obtain an ultrafine fiber-form cellulose suspension (2). A nonwoven fabric was prepared in the same way as in Example 21 using the ultrafine fiber-form cellulose suspension (2) as a raw material. Then, high-pressure vapor treatment was carried out to obtain a nonwoven fabric.

Comparative Example 6

A nonwoven fabric was obtained in the same way as in Example 21 except that the high-pressure vapor treatment was not carried out.

Comparative Example 7

A nonwoven fabric was obtained in the same way as in Example 25 except that the high-pressure vapor treatment was not carried out.

[Evaluation]

<Method>

(1) The total light transmittance, (2) the yellowness, and (3) the amount of a phosphoric acid group and the amount of a carboxyl group were measured for the nonwoven fabrics prepared in Examples 21 to 25 and Comparative Examples 6 and 7, by the same methods as in Examples 1 to 20 and Comparative Examples 1 to 5.

<Results>

The results are shown in Table 3.

obtained dehydrated sheet was diluted with 10 L of ion-exchange water, and a 1 N aqueous sodium hydroxide solution was added thereto in small portions with stirring to obtain pulp slurry having a pH of 12 to 13. Then, this pulp slurry was dehydrated to obtain a dehydrated sheet. Then, 10 L of ion-exchange water was poured again to the dehydrated sheet, which was then uniformly dispersed by stirring, followed by filtration and dehydration to obtain a dehydrated sheet. This step was repeated twice to obtain phosphoric acid-modified cellulose fiber. The amount of the phosphoric acid group introduced determined by the titration method was 1.1 mmol/g.

<Machine Process>

After washing and dehydration, ion-exchange water was added to the obtained pulp to prepare a pulp suspension having a concentration of 0.5% by mass. This pulp suspension was subjected to defibration treatment for 30 minutes under a condition of 21500 rpm using a defibration treatment apparatus (manufactured by M Technique Co., Ltd., Clearmix-2.2S) to obtain an ultrafine fiber-form cellulose suspension (1).

TABLE 3

| | | Amount of functional group introduced [mmol/g] | Vapor treatment | | Element concentration [kcps] | | | Amount of functional group introduced after vapor treatment [mmol/g] | Total light transmittance [%] | | Yellowness | |
|---|---|---|---|---|---|---|---|---|---|---|---|---|
| | Functional group | | Temperature [° C.] | Time [min] | Element species | Before vapor treatment | After vapor treatment | | Before vapor treatment | After vapor treatment | Before vacuum heating | After vacuum heating |
| Example 21 | Phosphoric acid group | 0.82 | 120 | 120 | P | 199 | 75 | 0.31 | 91.9 | 91.4 | 1.5 | 8.5 |
| Example 22 | Phosphoric acid group | 0.82 | 120 | 240 | P | 199 | 52 | 0.21 | 91.9 | 91.4 | 1.2 | 7.4 |
| Example 23 | Phosphoric acid group | 0.82 | 120 | 360 | P | 199 | 36 | 0.15 | 91.9 | 91.3 | 1.4 | 5.9 |
| Example 24 | Phosphoric acid group | 0.82 | 130 | 240 | P | 199 | 10 | 0.04 | 91.9 | 90.7 | 2.4 | 6.6 |
| Example 25 | Carboxyl group | 0.512 | 130 | 240 | Na | 17.3 | 3.4 | 0.04 | 91.2 | 91.0 | 1.9 | 6.4 |
| Comparative Example 6 | Phosphoric acid group | 0.82 | — | — | P | 199 | — | — | 91.9 | — | 1.7 | 16.7 |
| Comparative Example 7 | Carboxyl group | 0.512 | — | — | Na | 17.3 | — | — | 91.2 | — | 1.5 | 17.8 |

Example 26

<Preparation of Phosphorylated Cellulose Ultrafine Fiber>

100 g of urea, 55.3 g of sodium dihydrogen phosphate dihydrate, and 41.3 g of disodium hydrogen phosphate were dissolved in 109 g of water to prepare a phosphorylation reagent.

A sheet obtained by paper making from dried needle bleached kraft pulp (manufactured by Oji Holdings Corp.) was treated with a cutter mill and a pin mill to prepare cotton-like fiber. 100 g (absolute dry mass) of this cotton-like fiber was separated, and the phosphorylation reagent was evenly sprayed thereto. Then, the fiber was kneaded by hand to obtain chemical-impregnated pulp.

The obtained chemical-impregnated pulp was heat-treated for 80 minutes in an air-blow dryer with a damper heated to 140° C. to obtain phosphorylated pulp.

100 g (pulp mass) of the obtained phosphorylated pulp was separated, and 10 L of ion-exchange water was poured to the pulp, which was then uniformly dispersed by stirring, followed by filtration and dehydration to obtain a dehydrated sheet. This step was repeated twice. Subsequently, the <Change in Degree of Neutralization>

A strongly acidic ion-exchange resin (manufactured by Organo Corp.; Amberjet 1024) was added at a volume ratio of 1/10 to the obtained ultrafine fiber-form cellulose suspension (1), followed by shake treatment for 1 hour. Then, the suspension was poured to a mesh having an opening of 90 μm so that the slurry was separated from the resin to obtain an ultrafine fiber-form cellulose suspension (2).

The ultrafine fiber-form cellulose suspension (1) and the ultrafine fiber-form cellulose suspension (2) were mixed at a volume ratio of 75:25 to prepare an ultrafine fiber-form cellulose suspension (3).

<Sheet Formation>

Polyethylene glycol (manufactured by Wako Pure Chemical Industries, Ltd.; molecular weight: 4,000,000) was added to the ultrafine fiber-form cellulose suspension (3) so as to be 15 parts by mass with respect to 100 parts by mass of the ultrafine fiber-form cellulose. The suspension was measured such that the finished basis weight of a nonwoven fabric was 37.5 g/m$^{2'}$ The suspension was developed to a commercially available acrylic plate and dried in an oven of 50° C. A plate for damming was disposed on the acrylic plate so as to achieve the predetermined basis weight and to obtain a square nonwoven fabric. The nonwoven fabric was obtained by these procedures. The obtained nonwoven fabric had a thickness of 25 μm Example 27

A nonwoven fabric was obtained in the same way as in Example 26 except that the mixing ratio of the ultrafine fiber-form cellulose suspension (1) and the ultrafine fiber-form cellulose suspension (2) was changed to 50:50.

Example 28

The nonwoven fabric obtained in Example 27 was used as a base material, and resin layers were laminated on both sides of the base material by the following procedures: 26 parts by weight of a silsesquioxane resin ("Konposeran SQ107" manufactured by Arakawa Chemical Industries, Ltd.), 14 parts by weight of a curing agent ("HBSQ201" manufactured by Arakawa Chemical Industries, Ltd.), and 60 parts by weight of isopropyl alcohol were mixed to obtain a coating solution. Subsequently, one side of the base material was coated with the coating solution using a Meyer bar. Then, the coating solution was dried at 100° C. for 3 minutes and then cured by irradiation with ultraviolet light of 300 mJ/cm$^2$ using a UV conveyor apparatus ("ECS-4011GX" manufactured by Eye Graphics Co., Ltd.) to form a resin layer having a thickness of 5 μm. Another resin layer having a thickness of 5 μm was formed on the other side by the same procedures as above to obtain a composite of the base material and the resin.

Comparative Example 8

A nonwoven fabric was obtained in the same way as in Example 26 except that the mixing ratio of the ultrafine fiber-form cellulose suspension (1) and the ultrafine fiber-form cellulose suspension (2) was changed to 100:0.

Comparative Example 9

A nonwoven fabric was obtained in the same way as in Example 26 except that the mixing ratio of the ultrafine fiber-form cellulose suspension (1) and the ultrafine fiber-form cellulose suspension (2) was changed to 0:100.

Comparative Example 10

<Preparation of Carboxylated Cellulose Ultrafine Fiber>

Undried needle bleached kraft pulp corresponding to a dray mass of 200 g, 2.5 g of TEMPO, and 25 g of sodium bromide were dispersed in 1500 ml of water. Then, an aqueous solution containing 13% by mass of sodium hypochlorite was added thereto such that the amount of sodium hypochlorite was 5.4 mmol with respect to 1.0 g of the pulp to start reaction. During the reaction, the pH was kept at 10 to 11 by the dropwise addition of a 0.5 M aqueous sodium hydroxide solution. The point in time when change in pH was no longer seen was regarded as the completion of the reaction.

Then, this pulp slurry was dehydrated to obtain a dehydrated sheet. Then, 10 L of ion-exchange water was poured to the pulp, which was then uniformly dispersed by stirring, followed by filtration and dehydration to obtain a dehydrated sheet. This step was repeated twice. The amount of the carboxyl group introduced determined by the titration method was 1.0 mmol/g.

<Machine Process>

After washing and dehydration, ion-exchange water was added to the obtained pulp to prepare a pulp suspension having a concentration of 0.5% by mass. This pulp suspension was subjected to defibration treatment for 30 minutes under a condition of 21500 rpm using a defibration treatment apparatus (manufactured by M Technique Co., Ltd., Cleai-inix-2.2S) to obtain a fibriform cellulose suspension (4).

<Change in Degree of Neutralization>

A strongly acidic ion-exchange resin (manufactured by Organo Corp.; Amberjet 1024) was added at a volume ratio of 1/10 to the obtained ultrafine fiber-form cellulose suspension (4), followed by shake treatment for 1 hour. Then, the suspension was poured to a mesh having an opening of 90 μm so that the slurry was separated from the resin to obtain an ultrafine fiber-form cellulose suspension (5).

The ultrafine fiber-form cellulose suspension (4) and the ultrafine fiber-form cellulose suspension (5) were mixed at a volume ratio of 50:50 to prepare an ultrafine fiber-form cellulose suspension (6).

<Sheet Formation>

Polyethylene glycol (manufactured by Wako Pure Chemical Industries, Ltd.; molecular weight: 4,000,000) was added to the ultrafine fiber-form cellulose suspension (6) so as to be 15 parts by mass with respect to 100 parts by mass of the ultrafine fiber-form cellulose. The suspension was measured such that the finished basis weight of a nonwoven fabric was 37.5 g/m$^2$. The suspension was developed to a commercially available acrylic plate and dried in an oven of 50° C. A plate for damming was disposed on the acrylic plate so as to achieve the predetermined basis weight and to obtain a square nonwoven fabric. The nonwoven fabric was obtained by these procedures. The obtained nonwoven fabric had a thickness of 25 μm Comparative Example 11

A nonwoven fabric was obtained in the same way as in Comparative Example 10 except that the mixing ratio of the ultrafine fiber-form cellulose suspension (4) and the ultrafine fiber-form cellulose suspension (5) was changed to 100:0.

Comparative Example 12

26 parts by weight of a silsesquioxane resin ("Konposeran SQ107" manufactured by Arakawa Chemical Industries, Ltd.), 14 parts by weight of a curing agent ("HBSQ201" manufactured by Arakawa Chemical Industries, Ltd.), and 60 parts by weight of isopropyl alcohol were mixed. Then, the mixed solution was developed to a commercially available acrylic plate by calculation such that the thickness was 35 μm. Then, the solution was dried at 100° C. for 3 minutes and then cured by irradiation with ultraviolet light of 300 mJ/cm$^2$ using a UV conveyor apparatus ("ECS-4011GX" manufactured by Eye Graphics Co., Ltd.) to obtain a resin sheet.

[Evaluation]
<Method>

(1) The total light transmittance, (2) the yellowness, (3) the amount of a phosphoric acid group and the amount of a carboxyl group, (4) the haze, and (5) the linear thermal expansion coefficient were measured for the nonwoven fabrics of Examples 26 and 27 and Comparative Examples 8 to 11 and for the composite sheets of Example 28 and Comparative Example 12, by the same methods as in Examples 1 to 20 and Comparative Examples 1 to 5.

<Results>

The results are shown in Tables 4 and 5.

TABLE 4

| | | Amount of substituent introduced [mmol/g] | Degree of neutralization [%] | Physical properties of slurry | | | Physical properties of sheet | | | | |
|---|---|---|---|---|---|---|---|---|---|---|---|
| | | | | | | | | | | Yellowness (YI value) | |
| | Substituent | | | Solid concentration [%] | Total light transmittance [%] | Haze [%] | Thickness [μm] | Total light transmittance [%] | Haze [%] | Before heat-moisture treatment | After heat-moisture-treatment |
| Example 26 | Phosphoric acid group | 1.1 | 75 | 0.2 | 99.4 | 2.8 | 25 | 91.3 | 3.6 | 1.8 | 26.4 |
| Example 27 | Phosphoric acid group | 1.1 | 50 | 0.2 | 99.4 | 2.7 | 25 | 91.4 | 3.3 | 2.1 | 7.4 |
| Comparative Example 8 | Phosphoric acid group | 1.1 | 100 | 0.2 | 99.3 | 3.5 | 25 | 91.6 | 2.8 | 1.9 | 43.4 |
| Comparative Example 9 | Phosphoric acid group | 1.1 | 0 | 0.2 | 99.4 | 1.9 | 25 | 91.3 | 2.4 | 2.0 | 76.0 |
| Comparative Example 10 | Carboxyl group | 1.0 | 50 | 0.2 | 96.0 | 26.0 | 25 | 88.9 | 22.1 | 2.8 | 73.0 |
| Comparative Example 11 | Carboxyl group | 1.0 | 100 | 0.2 | 97.6 | 13.2 | 25 | 89.6 | 15.7 | 3.9 | 84.6 |

TABLE 5

| | Base sheet | Resin | Thickness [μm] (resin/base sheet/resin) | Total light transmittance [%] | Haze [%] | Yellowness (YI value) | | Linear thermal expansion coefficient [ppm/K] |
|---|---|---|---|---|---|---|---|---|
| | | | | | | Before heat-moisture treatment | After heat-moisture-treatment | |
| Example 28 | Example 27 | Polysilsesquioxane | 5/25/5 | 91.8 | 1.6 | 2.0 | 7.0 | 12.3 |
| Comparative Example 12 | — | Polysilsesquioxane | 35 | 91.3 | 0.5 | — | — | 139.1 |

The results of Examples 26 and 27 and Comparative Examples 8 and 9 demonstrated that when the treatment to change the degree of neutralization was not carried out, the yellowness of the phosphoric acid group-introduced ultrafine fiber-containing sheet after heat-moisture treatment was drastically increased, whereas yellowing was suppressed by the treatment to change the degree of neutralization. The results of Example 27 and Comparative Examples 8, 9, and 10 demonstrated that when the introduced substituent was a carboxyl group exhibiting weak acidity, change in the degree of neutralization was effective for improvement in staining, but caused aggregation and reduction in total light transmittance and haze.

From the results of Example 28, almost no change was observed in total light transmittance and yellowness between before and after resin composite formation. By the formation of a resin composite, the obtained resin composite was found to have suppressed yellowing and improved moisture resistance while exploiting the properties of the ultrafine fiber-containing sheet having transparency, a high modulus of elasticity, a low linear thermal expansion coefficient, and flexibility.

The invention claimed is:

1. A method for producing an ultrafine fiber-containing sheet, comprising at least:
    (a) introducing a substituent to a fiber raw material to obtain substituent-introduced fiber;
    wherein the substituent is at least one group selected from the group consisting of a phosphoric acid-derived group, a carboxylic acid-derived group, and a sulfuric acid-derived group; and
    wherein the fiber raw material is a material containing cellulose, chitin, and/or chitosan;
    (b) machine-processing the substituent-introduced fiber obtained in the step (a) to obtain substituent-introduced ultrafine fiber;
    (c) preparing a sheet from the substituent-introduced ultrafine fiber obtained in the step (b); and
    (d) eliminating at least a portion of introduced substituents by treating the sheet obtained in the step (c) with a heated alcohol.

2. The method according to claim 1, wherein the heated alcohol is a polyhydric alcohol.

3. The method according to claim 2, wherein the polyhydric alcohol has an OH/C ratio of 0.2 or more.

4. The method according to claim 1, wherein the average fiber width of the ultrafine fiber is 2 to 1000 nm.

5. The method according to claim 1, wherein the substituent is a phosphoric acid-derived group, and the method further comprises, after the step (a) and before the step (c), a step of (e) changing the degree of neutralization of the substituent-introduced fiber or the substituent-introduced ultrafine fiber.

6. The method according to claim 5, wherein the step (e) is carried out such that the degree of neutralization is 15 to 85%.

7. An ultrafine fiber-containing sheet produced by a method according to claim 1.

8. A composite sheet comprising a base sheet layer composed of an ultrafine fiber-containing sheet produced by a method according to claim 1, and an inorganic layer and/or an organic layer formed on at least one side of the base sheet layer.

9. The composite sheet according to claim 8, wherein the thickness of the base sheet layer is 0.1 to 1200 µm.

10. The composite sheet according to claim 8, wherein the inorganic layer comprises at least one member selected from the group consisting of silicon oxide, silicon nitride, silicon oxycarbide, silicon oxynitride, silicon oxycarbonitride, aluminum oxide, aluminum nitride, aluminum oxycarbide, and aluminum oxynitride.

11. The composite sheet according to claim 8, wherein the organic layer comprises a thermosetting resin or a photo-curable resin.

12. The composite sheet according to claim 8, wherein an inorganic layer and an organic layer laminated on the inorganic layer are disposed, or an organic layer and an inorganic layer laminated on the organic layer are disposed, on at least one side of the base sheet layer.

13. A flexible display, a solar cell, a lighting element, a display element, a touch panel, a window material, or a structural material comprising a composite sheet according to claim 8.

14. A product comprising a composite sheet according to claim 8.

15. A product comprising a solar cell, a lighting element, a display element, a touch panel, a window material, or a structural material according to claim 13.

* * * * *